United States Patent [19]
Momodomi et al.

[11] Patent Number: 5,508,957
[45] Date of Patent: Apr. 16, 1996

[54] NON-VOLATILE SEMICONDUCTOR MEMORY WITH NAND CELL STRUCTURE AND SWITCHING TRANSISTORS WITH DIFFERENT CHANNEL LENGTHS TO REDUCE PUNCH-THROUGH

[75] Inventors: Masaki Momodomi; Fujio Masuoka, both of Yokohama; Yasuo Itoh, Kawasaki; Hiroshi Iwahashi; Yoshihisa Iwata, both of Yokohama; Masahiko Chiba, Aomori; Satoshi Inoue; Riichiro Shirota, both of Kawasaki; Ryozo Nakayama, Yokohama; Kazunori Ohuchi, Yokohama; Shigeyoshi Watanabe, Yokohama; Ryouhei Kirisawa, Yokohama, all of Japan

[73] Assignee: Kabushiki Kaisha Toshiba, Kawasaki, Japan

[21] Appl. No.: 312,072

[22] Filed: Sep. 26, 1994

Related U.S. Application Data

[60] Continuation of Ser. No. 71,928, Jun. 4, 1993, abandoned, which is a division of Ser. No. 875,600, Apr. 28, 1992, abandoned, which is a continuation of Ser. No. 629,029, Dec. 18, 1990, abandoned, which is a continuation of Ser. No. 244,854, Sep. 15, 1988, abandoned.

[30] Foreign Application Priority Data

| Sep. 18, 1987 | [JP] | Japan | 62-233944 |
| Nov. 17, 1987 | [JP] | Japan | 62-288375 |
| Nov. 18, 1987 | [JP] | Japan | 62-290853 |
| Nov. 18, 1987 | [JP] | Japan | 62-290854 |
| Nov. 18, 1987 | [JP] | Japan | 62-290855 |
| Nov. 18, 1987 | [JP] | Japan | 62-290857 |
| Dec. 28, 1987 | [JP] | Japan | 62-329777 |
| Dec. 28, 1987 | [JP] | Japan | 62-329778 |
| Dec. 28, 1987 | [JP] | Japan | 62-329779 |
| Dec. 28, 1987 | [JP] | Japan | 62-329780 |

[51] Int. Cl.$^6$ .......................... G11C 16/04; G11C 16/06; H01L 29/788

[52] U.S. Cl. ................ 365/185.17; 257/315; 365/185.28

[58] Field of Search .................... 395/425, 430; 365/104, 184, 185, 189.05, 238.5; 257/315, 316

[56] References Cited

U.S. PATENT DOCUMENTS

| 4,142,176 | 2/1979 | Dozier | 326/44 |
| 4,233,526 | 11/1980 | Kurogi et al. | 365/184 |
| 4,694,314 | 9/1987 | Teruda et al. | 365/185 |
| 5,008,856 | 4/1991 | Iwahashi . | |
| 5,148,394 | 9/1992 | Iwahashi . | |

FOREIGN PATENT DOCUMENTS

| 0134390 | 10/1981 | Japan | 365/189.05 |
| 60-8559 | 3/1985 | Japan . | |
| 60-23436 | 6/1985 | Japan . | |
| 60-182162 | 9/1985 | Japan . | |

OTHER PUBLICATIONS

Adler, "Densely Arrayed EEPROM Having Low Voltage Tunnel Write", IBM Tech. Disc. Bull., vol. 27, No. 6, Nov. 1984, pp. 3302–3307.

Shirota et al, "A New NAND Cell For Ultra High Density 5v Only EEPROMs", 1988 Symposium on VLSI Tech., Dig. of Tech Papers., May 10–13, 1988, pp. 33–34.

Masuoka et al, "New Ultra High Density EPROM And Flash EPROM With NAND Structure Cell", Inter. Electron Devices Meeting (IEDM) Dig. of Tech. Papers, Dec. 6–9, 1987, pp. 552–555.

Shelton, "Low Power EEPROM Can Be Reprogrammed Fast", Electronics, Jul. 31, 1980, pp. 89–92.

"A High density EPROM cell and array", Symposium on VLSI technology digest of technical papers; pp. 89–90; May 1986; R. Stewart et al.

*Primary Examiner*—Glenn Gossage
*Attorney, Agent, or Firm*—Oblon, Spivak, McClelland, Maier & Neustadt

[57] ABSTRACT

An erasable programmable read-only memory with NAND cell structure includes NAND cell blocks, each of which has a selection transistor connected to the corresponding bit line and a series array of memory cell transistors, and a switching transistor connected between the series array of memory cell transistors and ground. Each cell transistor has a floating gate and a control gate. Word lines are connected to the control gates of the cell transistors. In a data writing mode, a selection transistor of a certain cell block containing a selected cell is rendered conductive, so that this cell block is connected to the corresponding bit line. Under such a condition, a decoder circuit stores a desired data (a logic "one" e.g.) in the selected cell, by applying an "H" level voltage to the bit line, applying an "L" level voltage to a word line connected to the selected cell, applying the "H" level voltage to a memory cell or cells positioned between the selected cell and the bit line, and applying the "L" level voltage to a memory cell or cells positioned between the selected cell and the ground. The selection transistor and switching transistor for a corresponding series array of memory cell transistors have different channel lengths to reduce punch through.

6 Claims, 24 Drawing Sheets

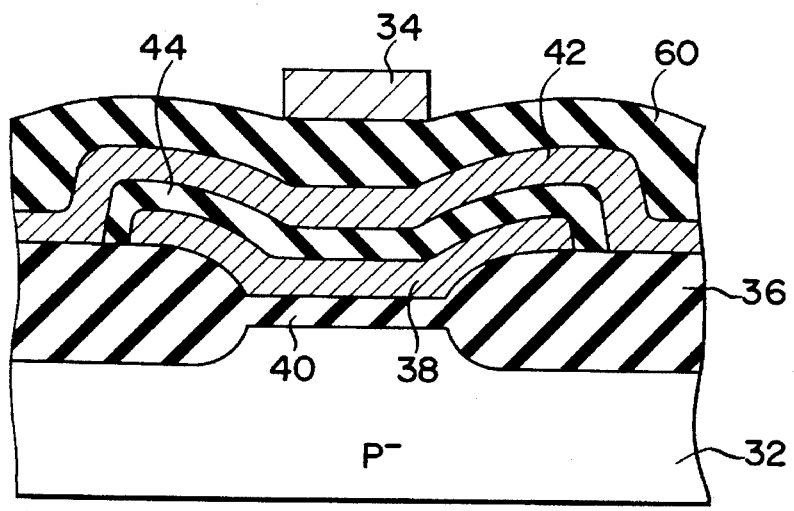
F I G. 3
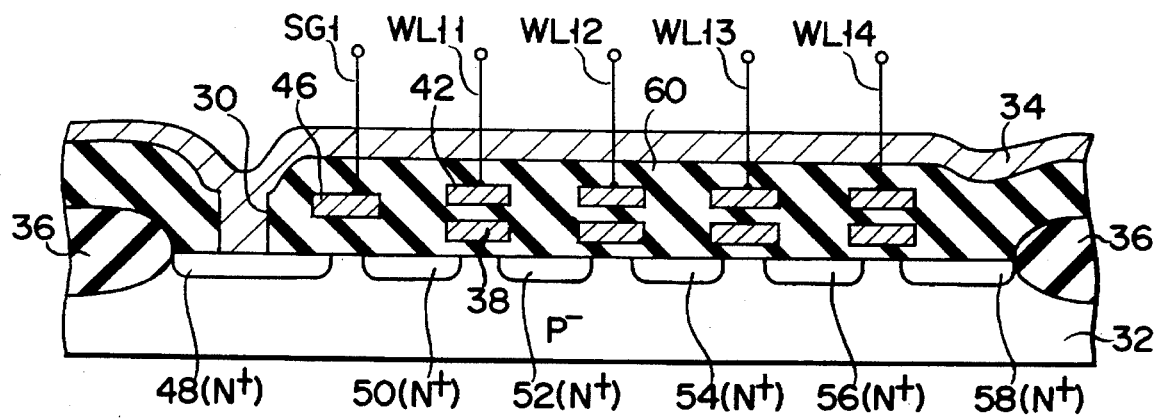
F I G. 4

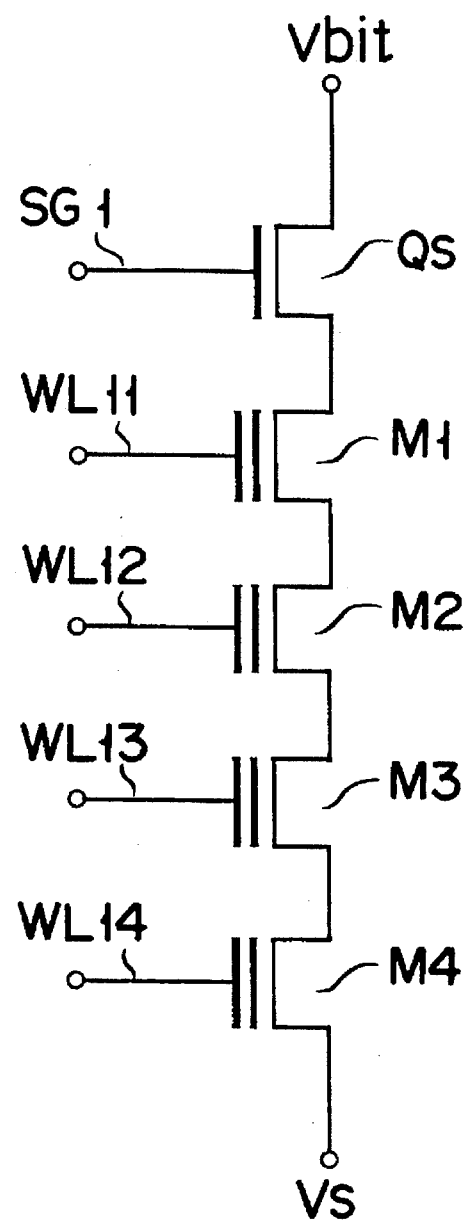
F I G. 5

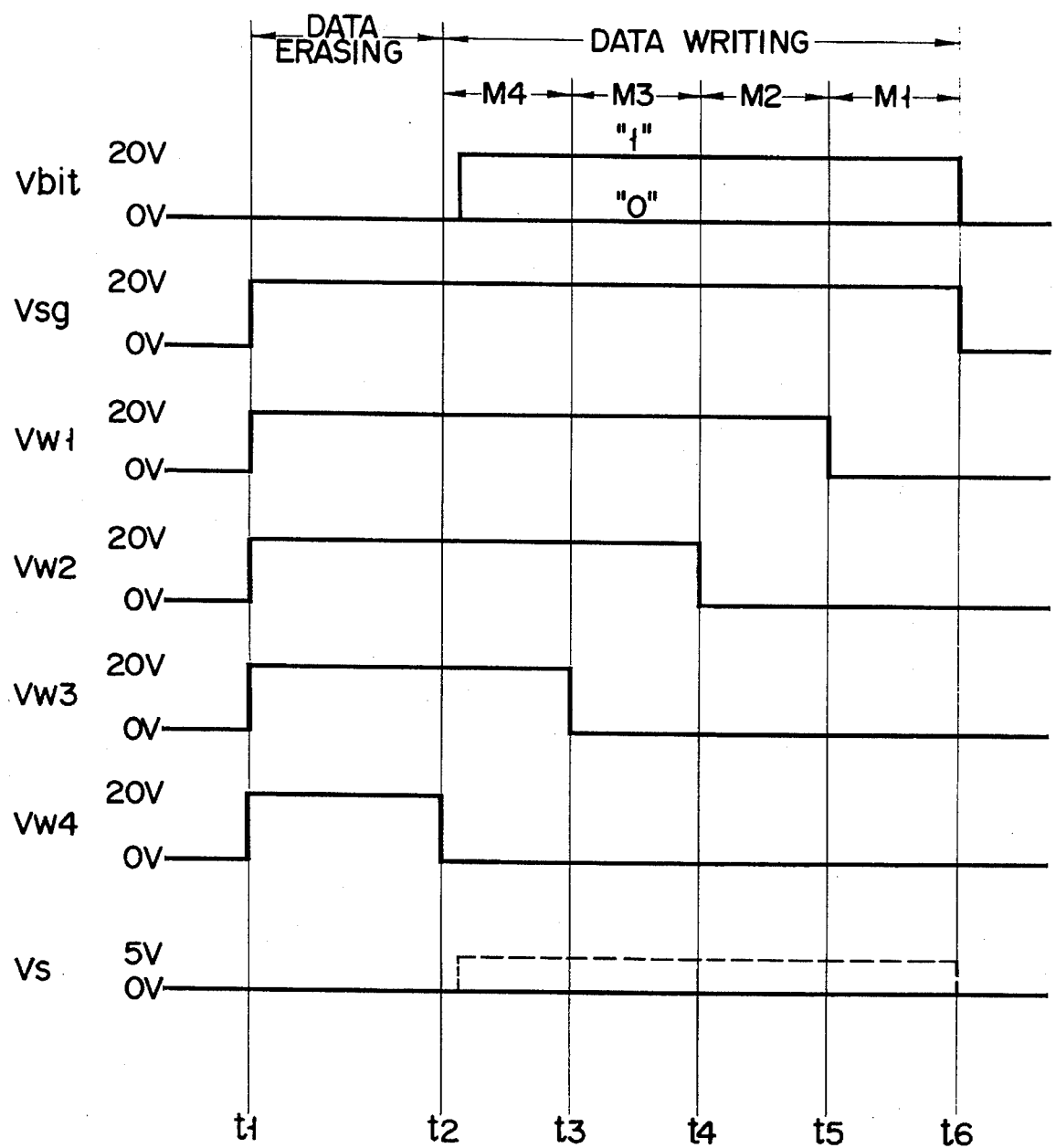
F I G. 6

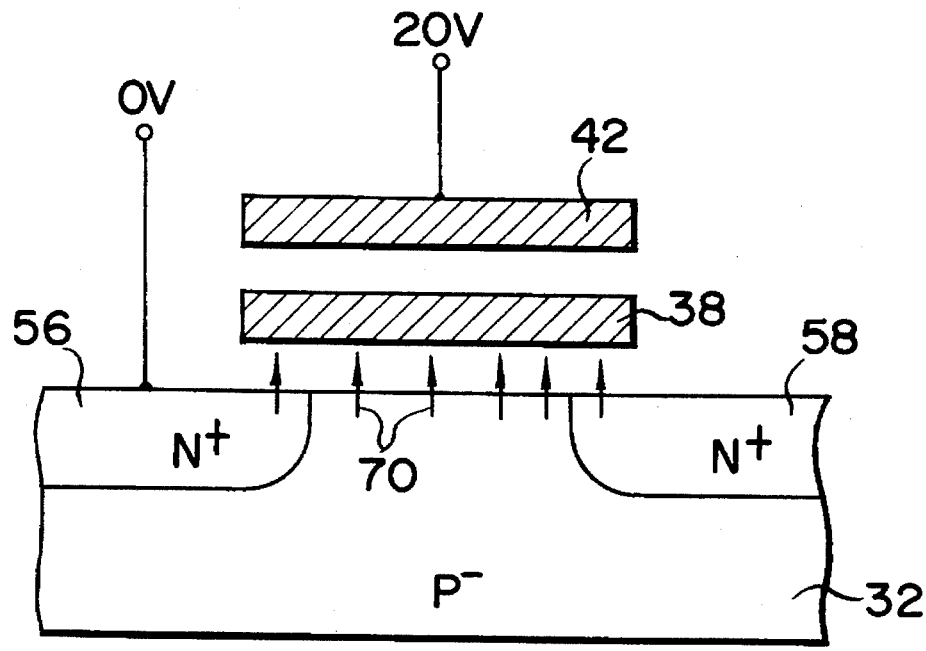
F I G. 7A
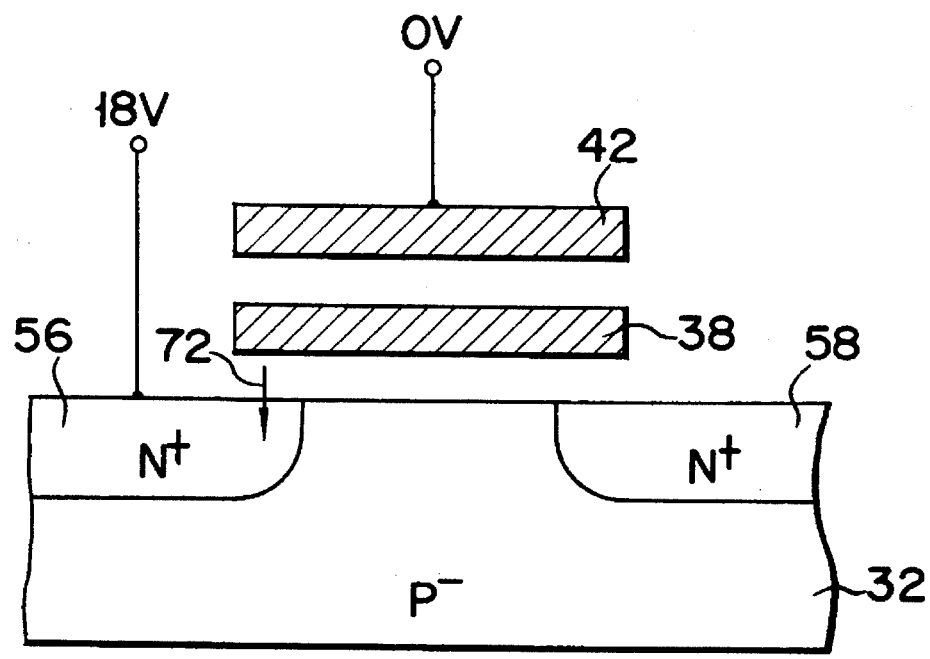
F I G. 7B

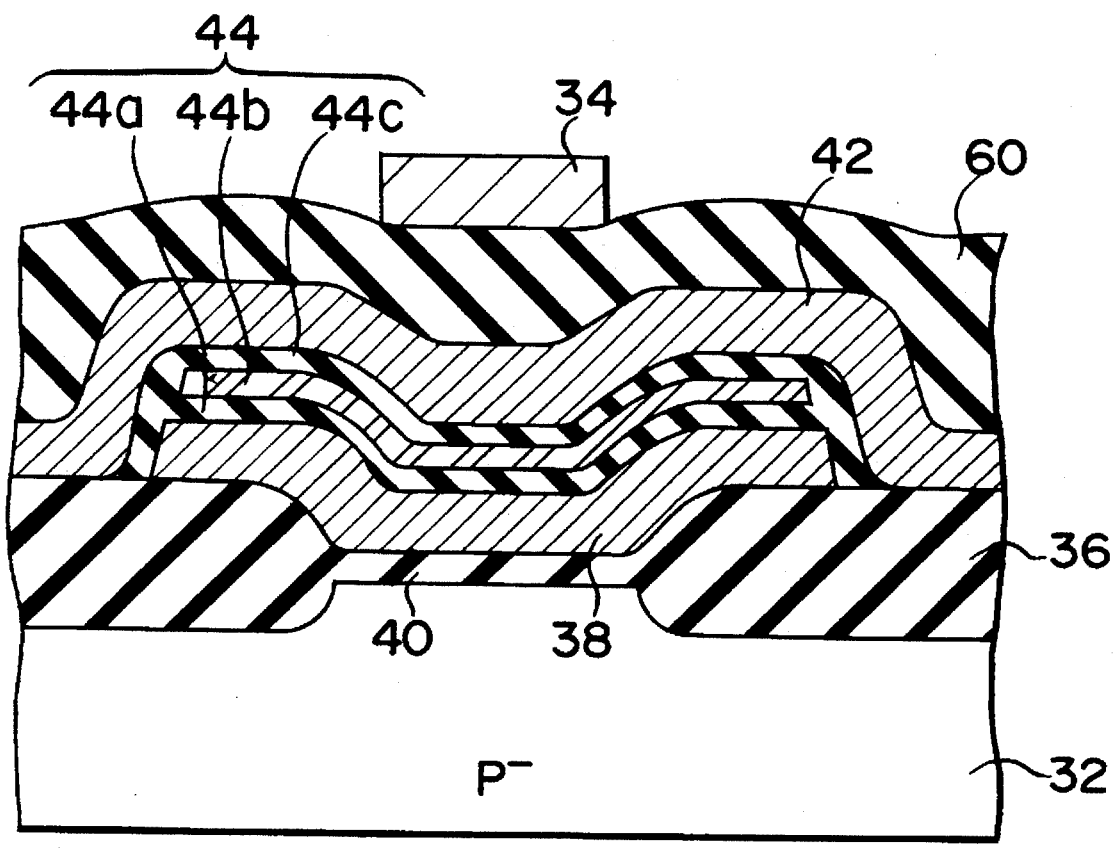
F I G. 9

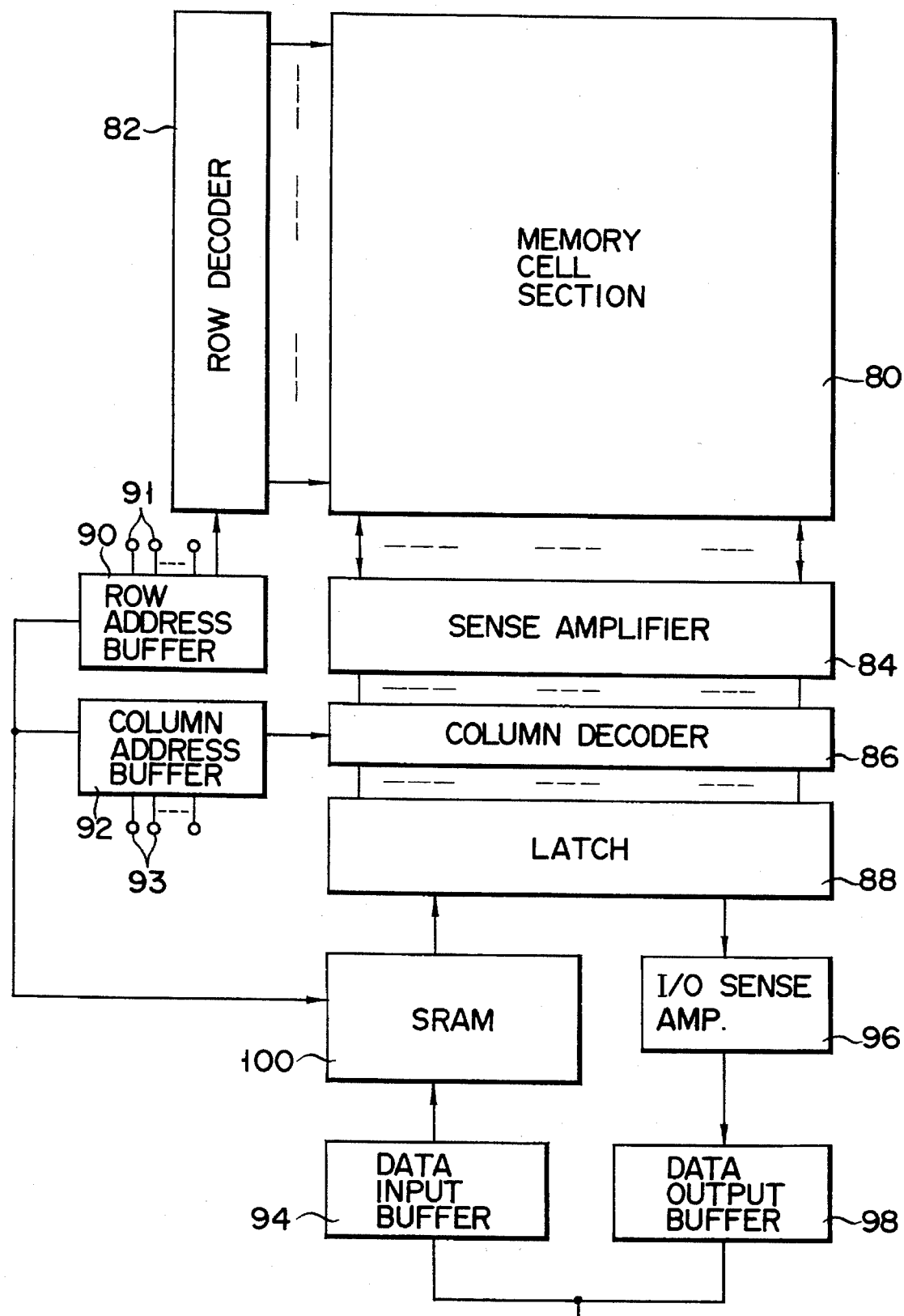
F I G. 10

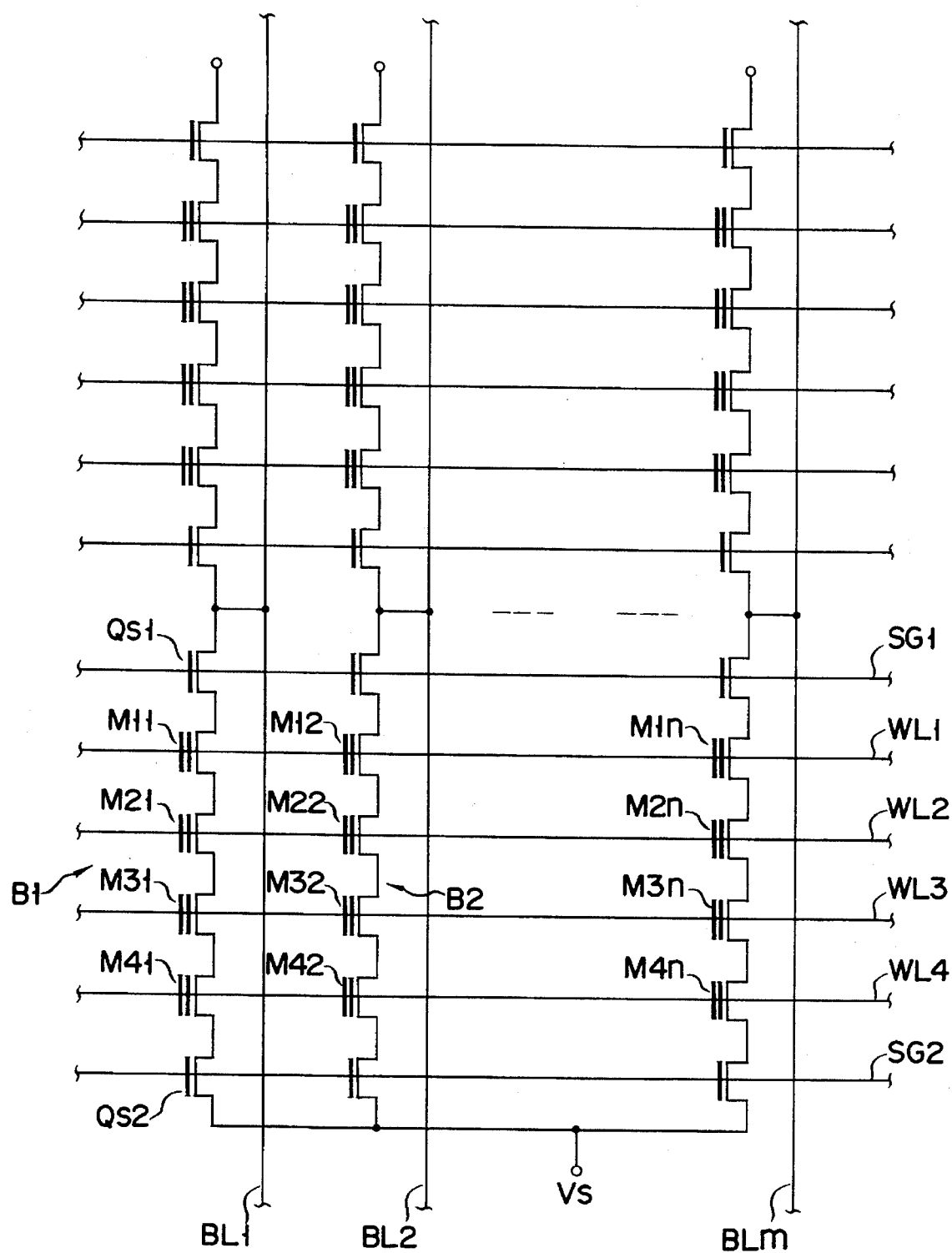
F I G. 11

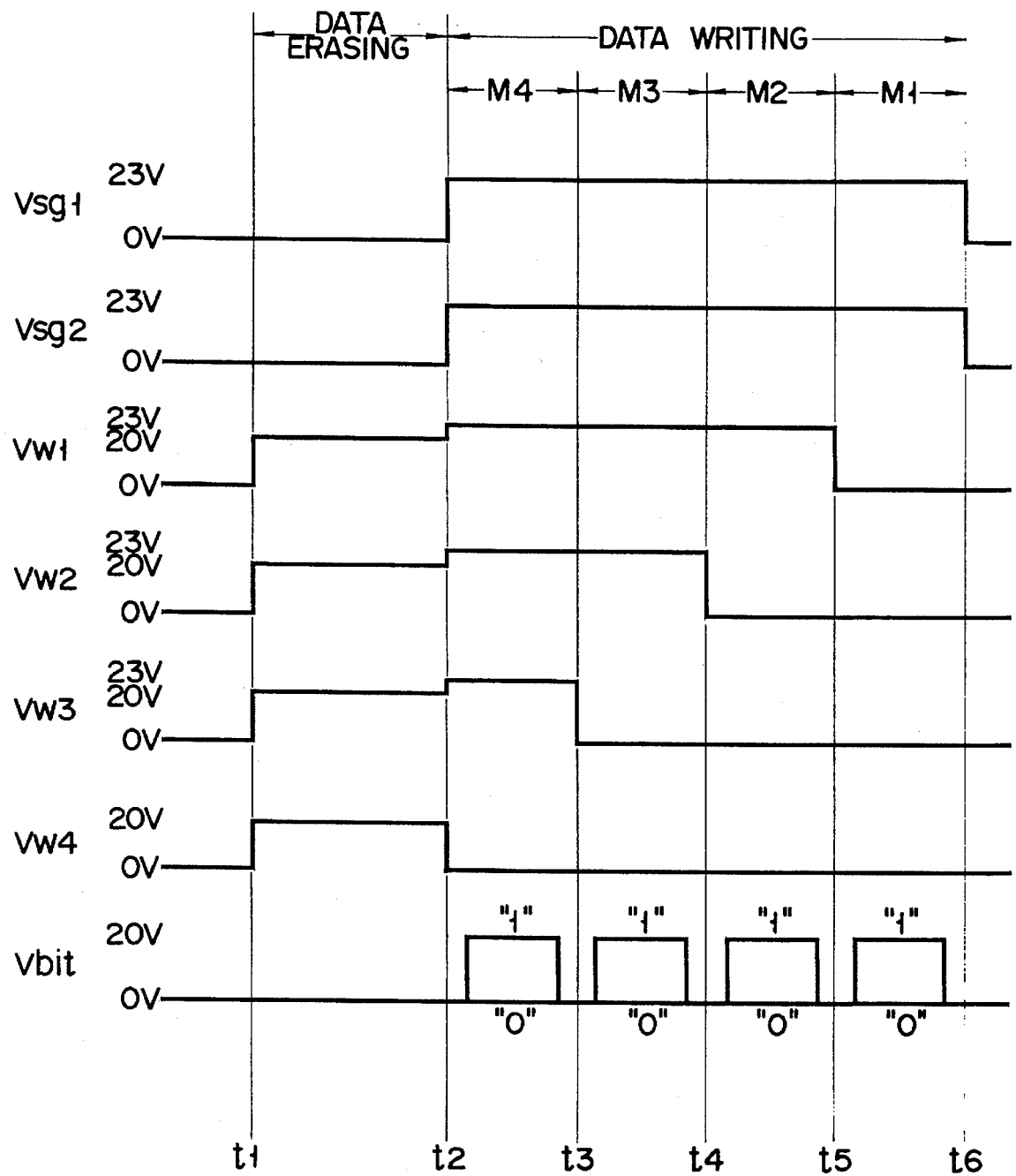
F I G. 14

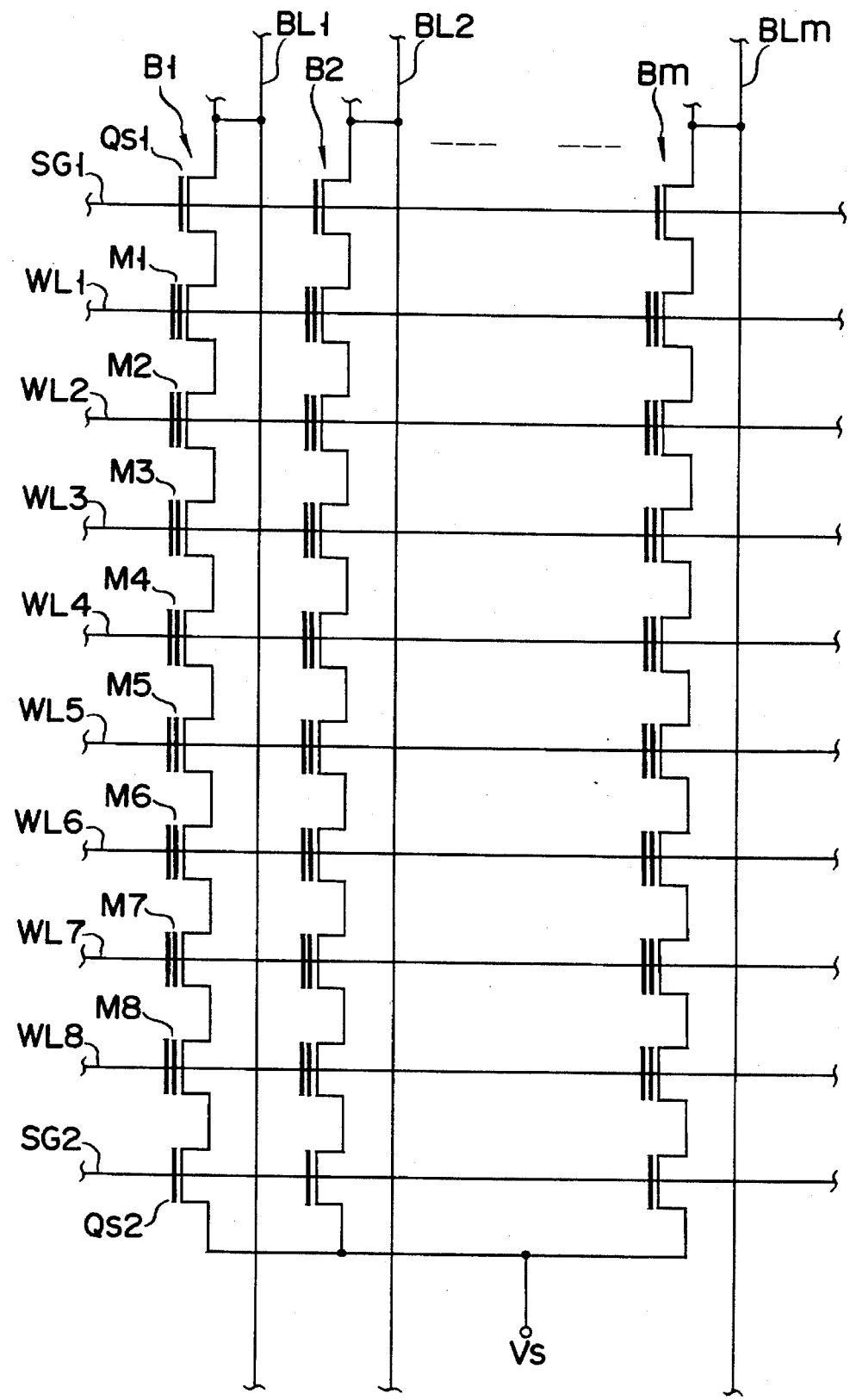
F I G. 19

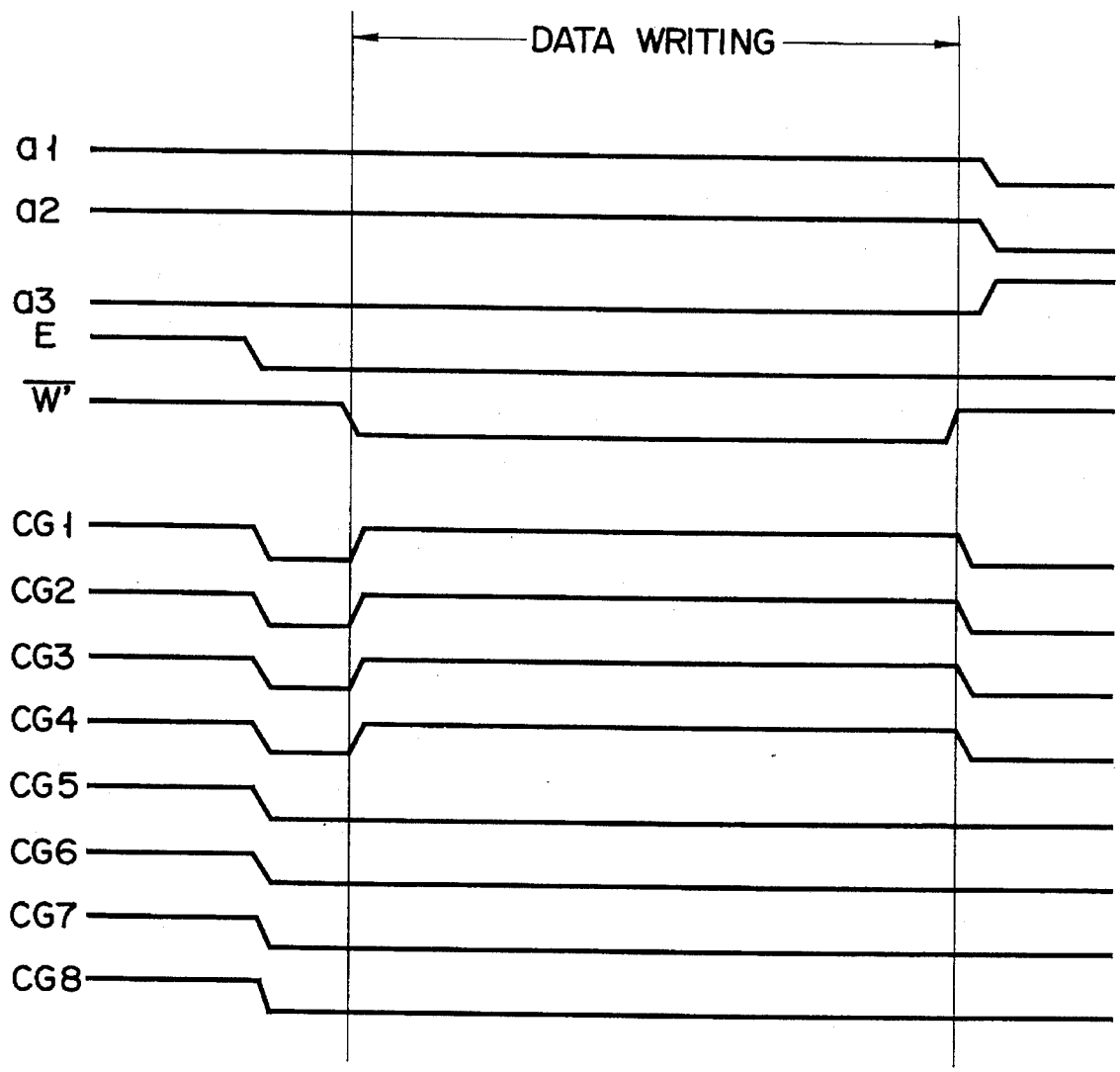
F I G. 20

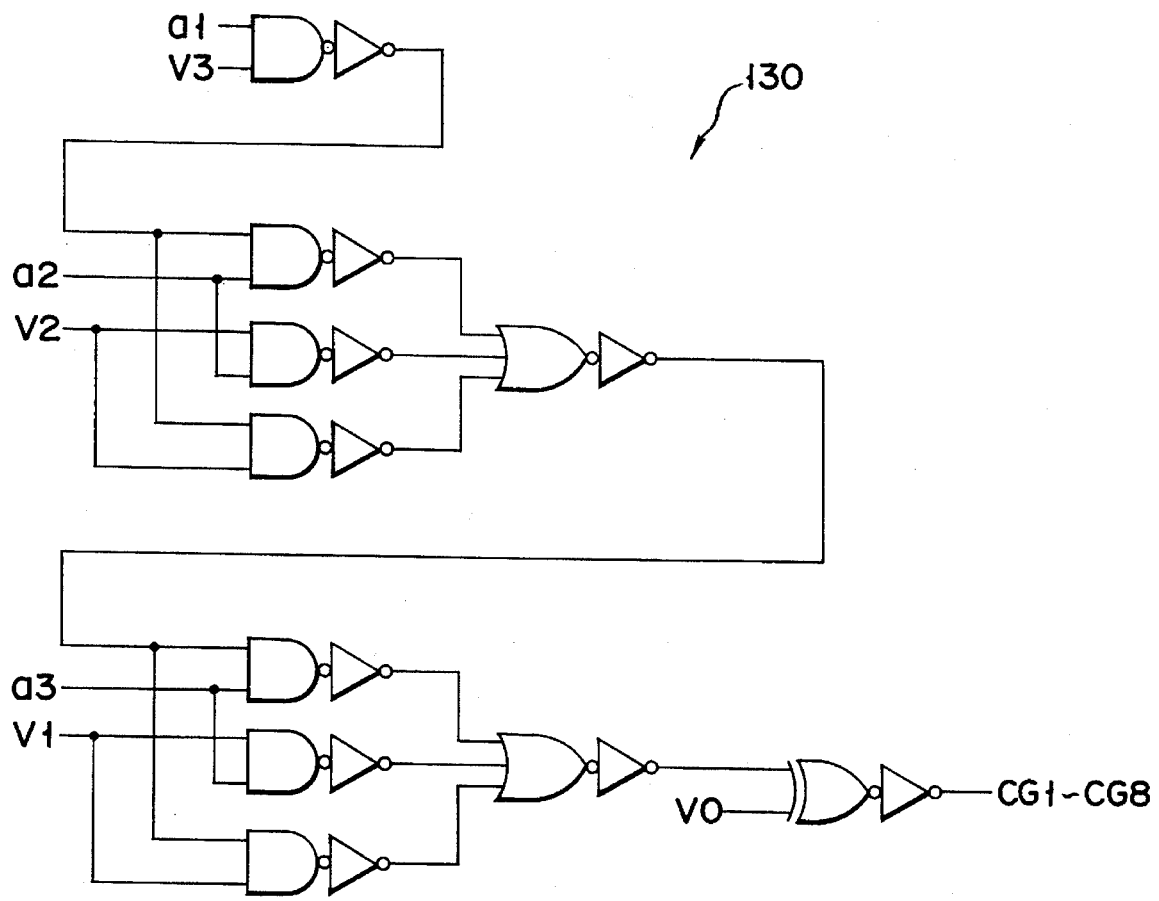
F I G. 21

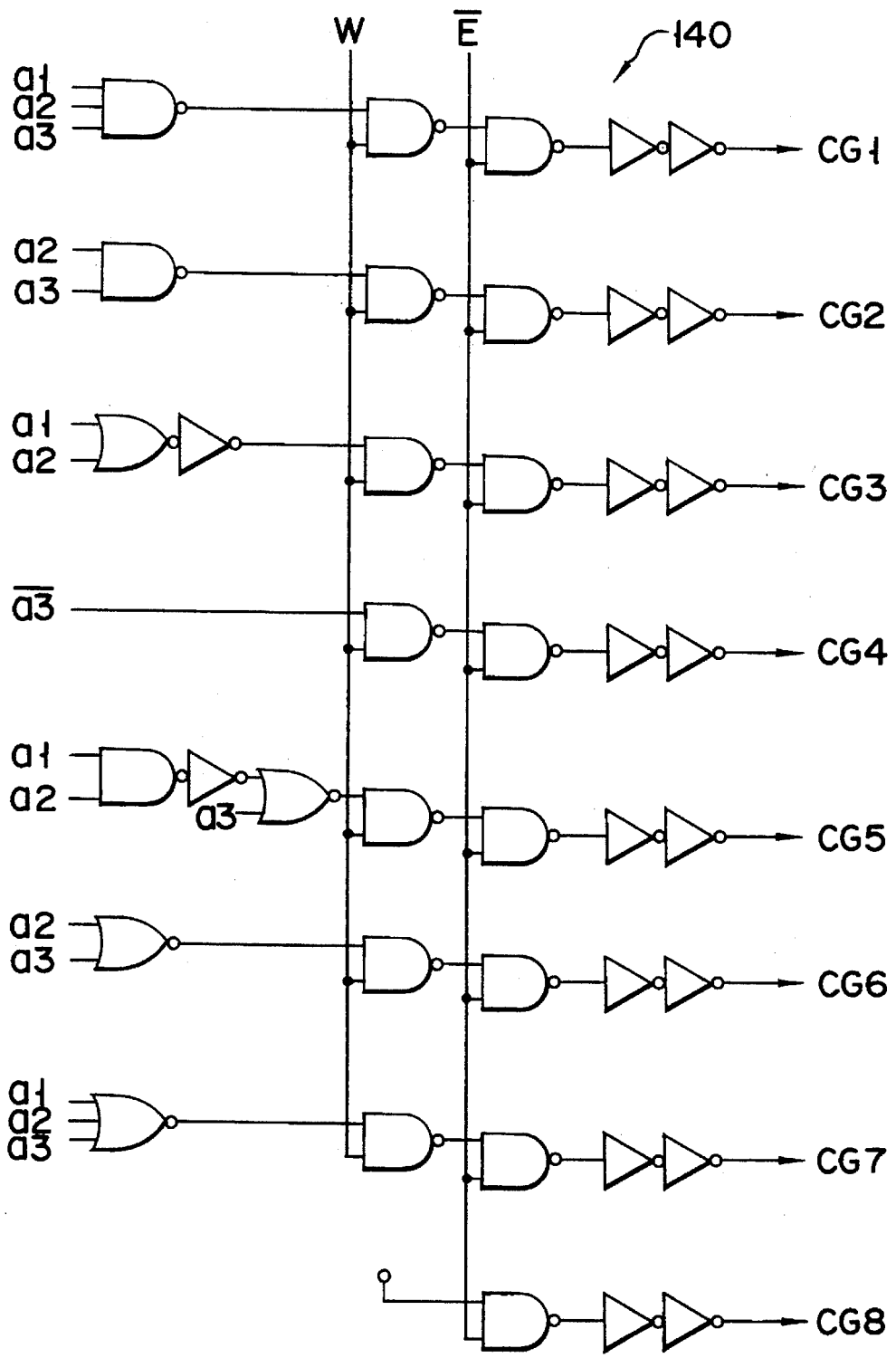
F I G. 22

NON-VOLATILE SEMICONDUCTOR MEMORY WITH NAND CELL STRUCTURE AND SWITCHING TRANSISTORS WITH DIFFERENT CHANNEL LENGTHS TO REDUCE PUNCH-THROUGH

This application is a Continuation of application Ser. No. 08/071,928, filed Jun. 4, 1993, abandoned, which is a divisional of application Ser. No. 07/875,600, filed Apr. 28, 1992, abandoned, which is a Cont. of application Ser. No. 07/629,029, filed Dec. 18, 1990, abandoned, which is a Cont. of application Ser. No. 07/244,854, filed Sep. 15, 1988, abandoned.

BACKGROUND OF THE INVENTION

1. Field of the Invention

The present invention relates to non-volatile semiconductor memories and, more particularly, to erasable programmable read-only memories with a large storage capacity.

2. Description of the Related Art

With the increasing needs for high performance and reliability of digital computer systems, the development of a semiconductor memory has strongly been desired which is large in storage capacity enough to replace an existing non-volatile data storage device, such as a magnetic floppy disk unit, for computer systems. Although being high in reliability, faster with respect to in data reading and writing speed and so on, presently-available electrically erasable programmable semiconductor read-only memories are not large enough in data storage capacity to replace the magnetic floppy disk unit.

In a conventional electrically erasable programmable read-only memory (EEPROM), each memory cell is typically comprised of two transistors, and the data write/erase operation is performed randomly one byte at a time. Therefore, the type of high-density integration that will provide a storage capacity large enough to replace peripheral data storage devices might be difficult to achieve.

As a non-volatile semiconductor memory of large capacity, an erasable programmable read-only memory with "NAND type cell" structure is proposed in "VLSI Symposium", R. Stewart et al., RCA, 1984, pp. 89–90. According to this reference the EEPROM shown only requires that each memory cell use a single transistor, and a single contact be provided between an array of memory cells arranged on a substrate to constitute an "NAND cell" structure and a corresponding bit line. Compared to the conventional EEPROMs, therefore, the area occupied by memory cells in the substrate can be reduced, improving the integration density.

However, a problem with in the area of above EPROM is the low reliability of operation. That is, when data is written into a selected cell, a non-selected cell (cells) adjacent to the selected cell may be brought into electrically unstable conditions. As a result, data may erroneously be written into the non-selected cell (cells). Such an erroneous write of data into the non-selected cell or cells would considerably degrade the reliability of the EEPROM, thus offering a serious problem.

SUMMARY OF THE INVENTION

It is therefore an object of the present invention to provide a new and improved non-volatile semiconductor memory.

It is another object of the present invention to provide a new and improved erasable programmable read-only memory which is well adapted for high-density integration for a large storage capacity and has high reliability in operation.

In accordance with the above objects, the present invention is addressed to a specific non-volatile semiconductor memory device comprising: a semiconductor substrate; parallel bit lines provided over the substrate; and rewritable memory cells connected to the bit lines. The memory cells comprise: NAND cell blocks each of which has (1) a selection transistor connected to a corresponding bit line; and (2) a series array of memory cell transistors having one end connected to the selection transistor and the other end connected to a substrate potential. Each of the transistors has a floating gate and a control gate. In each of the cell transistors, the coupling capacitance between the floating gate and the substrate is set smaller than the coupling capacitance between the floating gate and the control gate. Parallel word lines are provided over the substrate to intersect the bit lines and are connected to the control gates of the transistors.

A decoder circuit is connected to the bit lines and the word lines, and, in a data write mode, renders the selection transistor of a certain cell block including a selected memory cell conductive to electrically connect the certain cell block to a corresponding bit line, and applies a "H" level voltage to the corresponding bit line, a "L" level voltage to a word line connected to the selected cell of the certain cell block, a "H" level voltage to a memory cell or memory cells of the certain cell block located between the selected cell and the corresponding bit line, and a "L" level voltage to a memory cell (or memory cells) of the certain cell block located between the selected cell and the substrate, to thereby write desired data into the selected memory cell.

To sequentially write data into the memory cells included in the certain cell block, the decoder circuit first selects a memory cell disposed furthest from the corresponding bit line and then sequentially selects the remaining memory cells in the order of their disposition with the memory cell disposed nearest to the bit line being selected last. Memory cells into which data has been written are continuously supplied at their gates with a "L" level voltage while other memory cells are being selected. The decoder circuit applies, in a data erase mode, a "H" level voltage to the word lines connected to the control gates of all the memory cells included in the certain cell block, thereby simultaneously erasing these cell transistors.

The invention and its objects and advantages will become more apparent from the detailed description of the preferred embodiments.

BRIEF DESCRIPTION OF THE DRAWINGS

In the detailed description of a preferred embodiment of the invention presented below, reference is made to the accompanying drawings of which:

FIG. 3 is a diagram showing a cross-sectional view of the cell block taken along line III—III;

FIG. 4 is a diagram showing a cross-sectional view of the cell block along line IV—IV;

FIG. 5 is a diagram showing an equivalent circuit configuration of the cell block shown in FIG. 2;

FIG. 6 is a diagram showing the typical waveforms of the voltage signals generated at the main parts of the EPROM of this invention in the data erasing mode and the data writing mode;

FIG. 7A is a diagram showing an electron transferring mechanism of a certain memory cell of the EPROM in the data erasing mode;

FIG. 7B is a diagram showing an electron transferring mechanism of a certain memory cell of the EPROM in the data writing mode;

FIG. 9 is a diagram showing a cross-sectional view of a modified memory cell transistor which may be also used in the EPROM;

FIG. 10 is a diagram schematically showing the overall circuit configuration of an electrically erasable programmable read-only memory in accordance with a second embodiment of the present invention;

FIG. 11 is a diagram showing a memory cell matrix configuration of a cell section provided in the EEPROM shown in FIG. 10;

FIG. 14 is a diagram showing typical waveforms of voltage signals generated at the main parts of the second embodiment EPROM in the data erasing mode and the data writing mode;

FIG. 19 is a diagram showing a partial memory cell matrix arrangement of an EEPROM in accordance with another embodiment of this invention, which is associated with the decoder circuit shown in FIG. 18;

FIG. 20 is a diagram showing typical waveforms of voltage signals generated at the main parts of the decoder circuit of FIG. 18 and NAND cell arrays shown in FIG. 19 in the data writing mode;

FIG. 21 is a diagram showing the circuit configuration of a modification of the decoder circuit of FIG. 18;

FIG. 22 is a diagram showing the circuit configuration of another modification of the decoder circuit of FIG. 18;

DETAILED DESCRIPTION OF THE PREFERRED EMBODIMENTS

Figure 1:
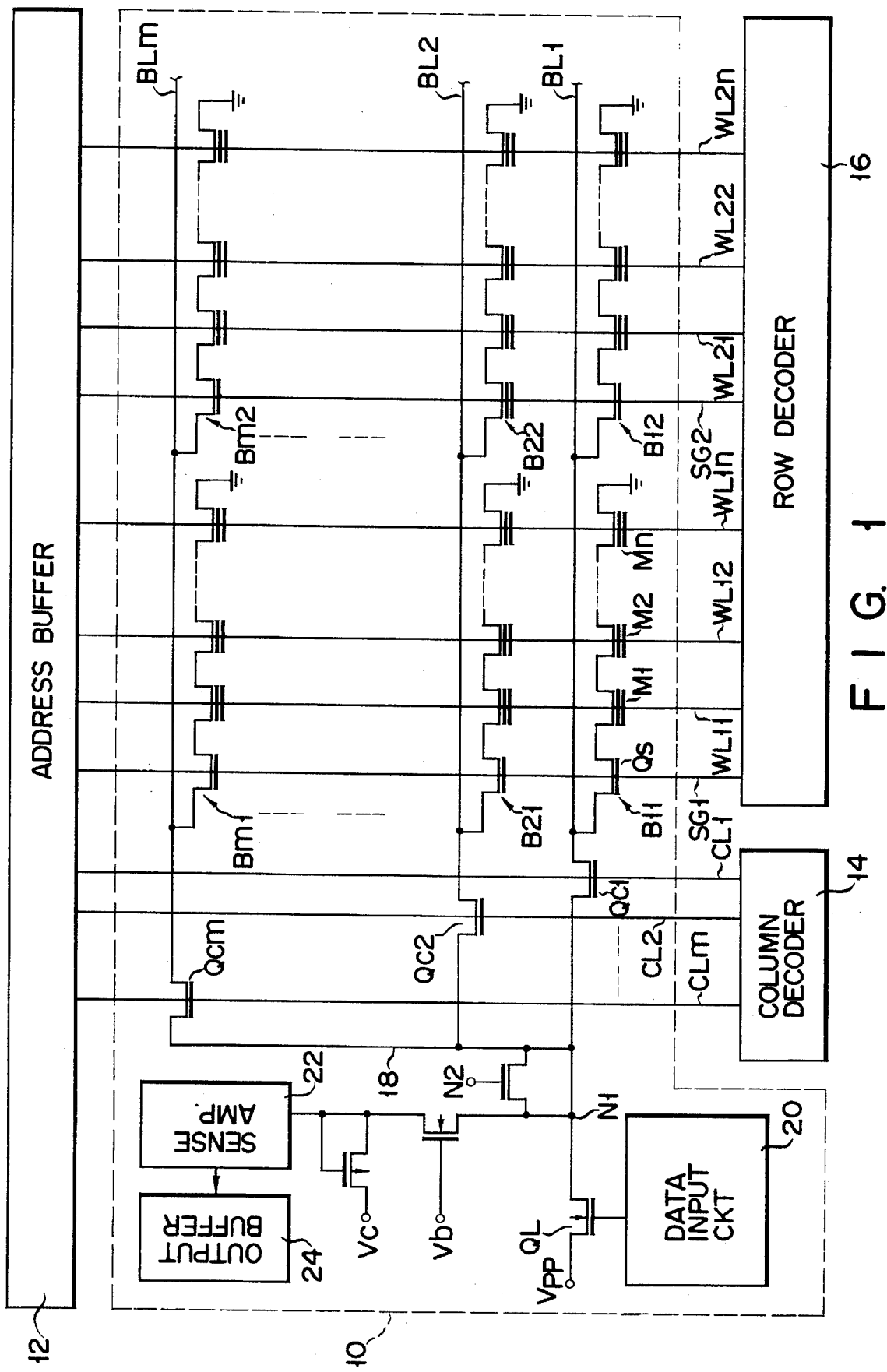
FIG. 1 is a diagram schematically showing the overall circuit configuration of an electrically erasable programmable read-only memory in accordance with the preferred embodiment of the present invention.

Referring now to FIG. 1, an electrically erasable programmable read-only memory according to a preferred embodiment of the present invention comprises a cell array section 10, an address buffer section 12, a column decoder section 14 and a row decoder section 16, which are all form,ed on a chip substrate not shown.

Over the substrate a selected number of parallel bit lines BL1, BL2, ... BLm are formed which are insulated from one another. (Hereinafter, when one of these bit lines is referred to, the reference character "BLi" is used.) Each of these bit lines is connected with a plurality of memory cells. The cells are divided into sub-arrays (hereinafter referred to as "NAND cell blocks" or simply as "cell blocks") B11, B12 ... each of which has a selection transistor Qs and a selected number of memory cells M, which may be referred to as a series array or group of memory cells M. (Hereinafter, the reference character Mij is used to designate one of these memory cells.) Selection transistor Qs is formed of a single-gate metal oxide semiconductor field effect transistor (MOSFET). Each of memory cells is essentially formed of a double-gate MOSFET which has a floating gate and a control gate.

The series-connection of transistors in each NAND cell block Bij has an end connected to a corresponding bit line through Qs and the other end grounded to the substrate. In this embodiment, memory cells M of each cell block Bij are formed of memory cell transistors M1, M2, ... Mn which are series connected to constitute the so-called "NAND cell" structure. In the following description, the number "n" of the memory cell transistors contained in each cell block is set to four for the purpose of simplification of the drawings alone. With a practical application, however, the number "n" of the memory cell transistors would be eight or sixteen.

Parallel word lines WL11, WL12, ..., WL1n, WL21, ..., WL2n connected to row decoder 16 are provided over the substrate so that they are normal to bit lines BL. Selection transistors Qs and memory cell transistors M are placed at intersections of bit lines BL and word lines Wl as shown, thereby forming a cell matrix. Here it is to be noted that a line SGi connected to selection transistor Qs in each cell block Bij may be also referred to as a "gate control line" in this description.

Parallel column control lines CL1, CL2, ..., CLm run normal to bit lines BL1, BL2, ..., Blm over the substrate. MOSFETs Qc1, Qc2, ..., Qcm are placed at respective intersections of column lines CL1 and bit lines BLi (i=1 to m). MOSFETs Qc (1 ... m) have their drains connected together by a line 18. To this line 18 there is connected a data input circuit 20, a sense amplifier circuit 22, an output buffer 24 and transistors inclusive of a data input transistor QL, as shown.

Figure 2:
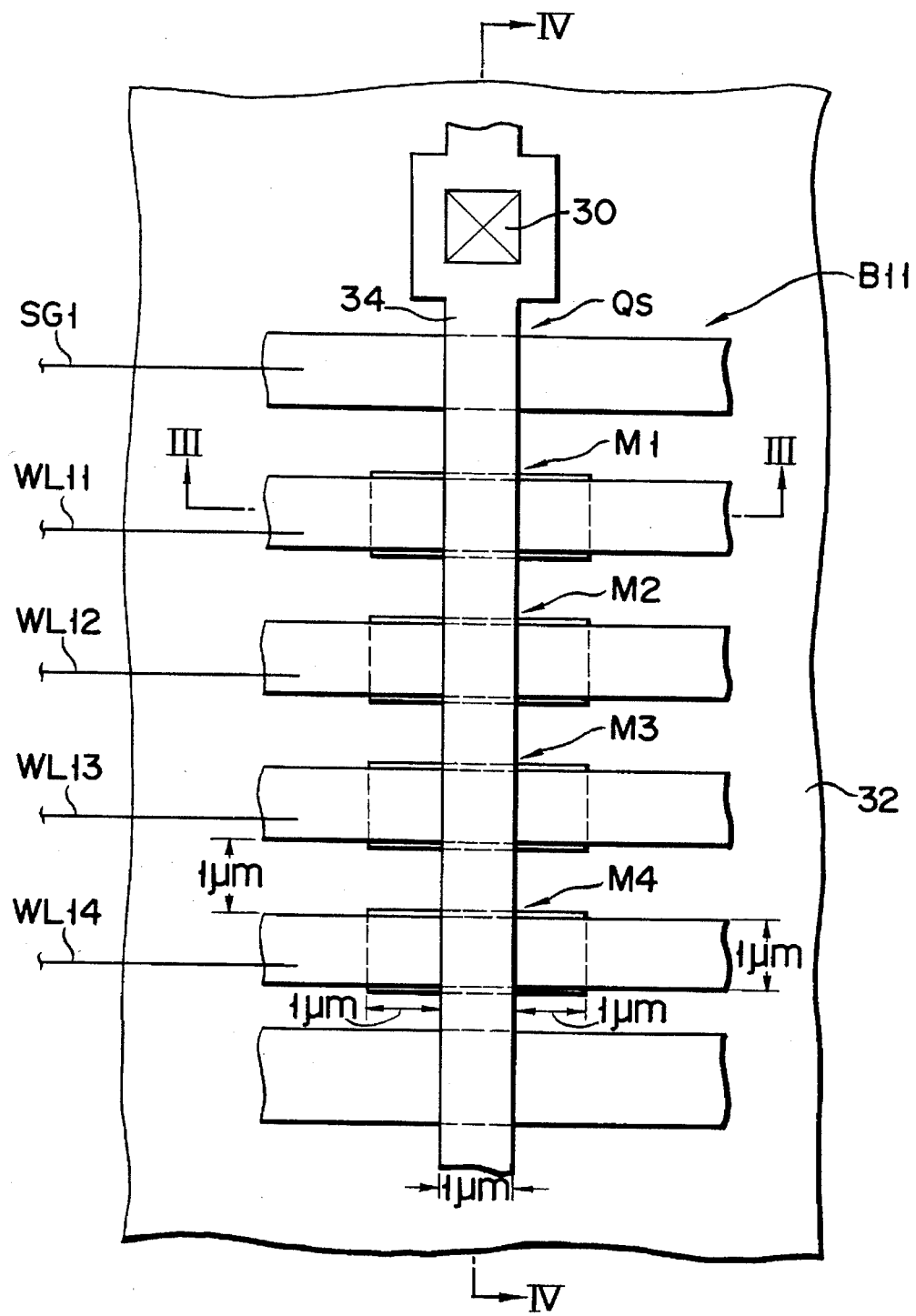
FIG. 2 is a diagram showing a plan view of a NAND cell block including a selection transistor and memory cell transistors which are series-connected to constitute the "NAND cell" structure.

As shown in FIG. 2, a NAND cell block (by way of example, "B11") has a contact hole 30 on lightly-doped P type silicon substrate 32. More specifically, a connection line (aluminum strip) 34 runs over the series combination of transistors Qs and M. Aluminum strip 34 overlaps the gates of transistors Qs and M in cell block B11.

As shown in FIGS. 3 and 4, the transistor array of NAND cell block B11 is formed in a substrate surface area surrounded by a device-isolating insulating layer 36 which is formed on substrate 32. As shown most clearly in FIG. 3, MOSFET M1 forming one memory cell as well as other memory cells has a first polysilicon layer 38 insulatingly disposed by a thermally oxidized insulating layer 40 over substrate 32 and a second polysilicon layer 42 insulatingly disposed by a gate insulation layer 44 over layer 38. First polysilicon layer 38 serves as the floating gate of MOSFET Mi, whereas second polysilicon layer 42 serves as the control gate of MOSFET Mi. Control gate layer 42 is formed to run along one direction, thereby constituting a word line (word line WL11 for memory cell M1). As shown in FIG. 4, selection transistor Qs has a polysilicon layer 46 insulatingly disposed over substrate 32. This polysilicon layer 46 serves as the control gate of transistor Qs.

As shown in FIG. 4, in the surface portion of substrate 32 heavily-doped N type diffusion layers 48, 50, 52, 54, 56, 58 are formed by a self-aligned process using the gates of transistors Qs, M1, M2, M3, M4. These N+ diffusion layers serve as the sources and drains of transistors. For instance, N+ diffusion layers 48 and 50 serve as the drain and source, respectively, of selection transistor Qs. Likewise, N+ diffusion layers 50 and 52 serve as the drain and source, respectively, of cell transistor M1. The series combination of the transistors arranged for constituting the "NAND cell" structure has an equivalent circuit as shown clearly in FIG. 5.

The entire surface of the layer structure is covered with a CVD insulating layer 60. In CVD insulating layer 60 a through hole is formed as shown to serve as a contact hole 30 for the series transistor array of the cell block Bij. The contact hole is located on source diffusion layer 48 of selection transistor Qs. Aluminum strip 34 runs on CVD insulating layer 60 and contacts with drain diffusion layer 48 of selection transistor Qs through contact hole 30. Strip 34 is selectively connected to either a data input line or a data output line.

It should be noted that, in each cell Mi, the coupling capacitance Cfs between floating gate 38 and substrate 32 is set smaller than the coupling capacitance Cfc between floating gate 38 and control gate 42. The pattern layout of the series combination of the transistors in cell block B11 is designed in accordance with the "1 micrometer" rule as shown in FIG. 2. More specifically, the width of the floating gate of each cell transistor Mi is 1 micrometer, the width of the control gate is 1 micrometer, the channel width is 1 micrometer, the spacing between the gate layers of adjacent cell transistors is 1 micrometer, and the width of aluminum strip 34 is 1 micrometer. First gate insulating layer 40 (see FIG. 3) is formed of a thermal oxide film of 20 nanometers in thickness, for example, whereas second gate insulating layer 44 (see FIG. 3) is formed of a thermal oxide film of 35 nanometers in thickness, for example. Assuming the dielectric constant of the thermal oxide film to be "$\epsilon$", the coupling capacitances will be given by $Cfs=\epsilon/0.02$ $Cfc=3\epsilon/0.035$ Thus, the above condition, Cfs<Cfc, is satisfied.

The operation modes of the EPROM of the present invention will be described hereinafter with reference to FIG. 6. In this Figure, the potential of the corresponding bit line is represented by "Vbit", and the gate potential of selection transistor Qs is represented by "Vsg". Further, the potentials applied to word lines WL11, . . . WL14 are represented by "Vw1", "Vw2", "Vw3", "Vw4", respectively.

The EEPROM performs simultaneous erasure of data stored in all of memory cells (because of this feature, the EEPROM of the present invention is also called a "flash EEPROM"). At this time, data stored in all the cell transistors M in each cell block are simultaneously erased in the following manner. In order to simultaneously erase all the memory cells including cells M1 to M4 in cell blocks B11, B21, . . . Bm1 connected to word lines WL11 to WL1n, it is required that a logic "H" level voltage (e.g. +20 volts) be applied to word lines WL11 to WL1n, a logic "H" level voltage be applied to column lines C1 to Cm, and a logic "H" level voltage be applied to node N2.

To detail the mechanism of the data erasure, cell block B11 will be considered by way of example. The same mechanism applies to the other cell blocks. In the simultaneous erasing mode (corresponding to a time interval between t1 and t2 in FIG. 6), the bit-line potential Vbit for cell block B11 is set to a low potential (0 volt), and the gate potential Vsg of selection transistor Qs is set to a high potential (20 volts). At the same time, word lines WL11, WL12, WL13 and WL14 are supplied with high-level voltage signals ("H" level is 20 volts, for instance) as shown in FIG. 6. As a result, in each of cell transistors M1 to M4, electrons will be tunneled to floating gate 38 from substrate 32 (its potential Vs is kept at 0 volt as shown in FIG. 6) through gate insulating layer 40, whereby the threshold value becomes positive. The movement of electrons in any cell transistor Mi in the simultaneous erasing mode will be effected substantially uniformly between substrate 32 and floating gate 38 as represented by arrows designated at reference numeral 70 in a model shown in FIG. 7A.

In the data writing mode, transistor QL is rendered conductive under the control of data input circuit 20. To specify cell block B11, for example, column decoder 14 applies a logic "H" level voltage to column line CL1 and a logic "L" level voltage to the remaining column lines CL2 to CLm. Alternatively "logic L" level voltage can be applied to the column decoder 14 for selection. At this time, row decoder 16 applies a logic "H" level voltage to gate control line SG1 connected to selection transistor Qs in cell block B11 to turn transistor Qs on.

Memory cells M1 to M4 in the selected memory cell block B11 are written into in the following sequence: memory cell M4 located furthest from contact hole 30 in cell block B11 is first written into, subsequently, memory cells M3 and M2 are sequentially written into, and memory cell M1 nearest contact hole 30 is written into lastly.

In the interval between t1 and t2 during which memory cell M4 is to be written into, the potential of aluminum strip 34 connected to the drain of selection transistor Qs, that is, the potential Vbit of corresponding bit line B1 is set to a high potential (20 volts) or a low potential (0 volt) according to whether digital binary data to be written into is a "1" or a "0". The gate potential Vsg of selection transistor Qs is set to a high level (20 volts). The potential Vw4 of word line WL14 connected to control gate 42 of selected cell M4 is set to a low potential level (0 volt), whereas the potential of each of word lines Vw1, Vw2, Vw3 is fixed at a high potential level (20 volts).

Under such a circumstance, selection transistor Qs is rendered conductive, and thus the bit line potential Vbit, in this case 20 V, is transferred to drain layer 56 of selected memory cell transistor M4 via channels of the series array of transistors of cell block B11. Control gate 42 of cell transistor M4 is impressed with a low-level voltage (0 volt) with the result that it is rendered non-conductive and that a high electric field is produced between floating gate 38 and substrate 32 in memory cell M4. As described above, the coupling capacitance Cfs between floating gate 38 and substrate 32 is smaller than the coupling capacitance Cfc between floating gate 38 and control gate 42. Therefore, electrons accumulated at floating gate of selected cell transistor M4 are discharged to substrate 32 through gate insulating layer 40 by means of the tunnel effect. (The movement of electrons is mainly effected between floating gate 38 and heavily-doped diffusion layer 56 as represented by an arrow 72 in the model of FIG. 7B. It is to be noted that, in FIG. 7B, the voltage applied to N+ diffusion layer 56 is represented as "18 V". This is because the bit-line voltage Vbit undergoes a voltage drop of the threshold voltage of selection transistor Qs.) As a result, the threshold value is rendered negative. This means that, according to the present embodiment, data "1" has been written into memory M4. During this interval between t2 and t3, the control gates of nonselected cells M1, M2 and M3 are impressed with a high voltage (20 volts) so that such discharge of electrons from the floating electrode as in selected cell M4 is inhibited.

Subsequently, when memory cell M3 is selected, namely, during the interval between t3 and t4, the potential Vw3 of word line WL13 connected to control gate 42 in cell M3 is set to a low voltage (0 volt) as with cell M4, as shown in FIG. 6. In this case, the gate voltage Vsg of selected transistor Qs and the voltages Vw1 and Vw2 of word lines WL11 and WL12 are kept at a high level (20 volts). It should be noted that, when cell M3 is selected, word line WL14 connected to the above cell M4 into which data has been written is controlled to keep a low voltage level, thereby avoiding the disappearance or erasure of the data which has been written into cell M4. Subsequently, data are sequentially written into cells M2 and M1 in the same manner as described above. During a time that cell M2 is being written into (namely, in the interval between t4 and t5), the potentials Vw4 and Vw3 of word lines WL14 and WL13 of cells M4 and M3 which have completed the data writing thereinto are kept at a low level (0 volt). During a time that cell M1 is being written into lastly (in the interval between t5 and t6), the potentials Vw4, Vw3 and Vw2 of word lines WL14, WL13 and WL12 of cells into which data has been written into are kept at a low level (0 volt). When bit line voltage Vbit is set to 20 volts as shown in FIG. 6, logic "1" data is written into a selected cell; and, when bit line voltage Vbit is 0 volts, logic "0" data remains therein. As a result, a desired pattern of logic "1" and "0" data is stored in memory cells M1 to M4.

In this context, the row and column decoders, the column selection transistors, the data input transistor and the data input circuit can be broadly construed as a voltage controller or program means for sequentially programming the individual memory cells.

Figure 8:
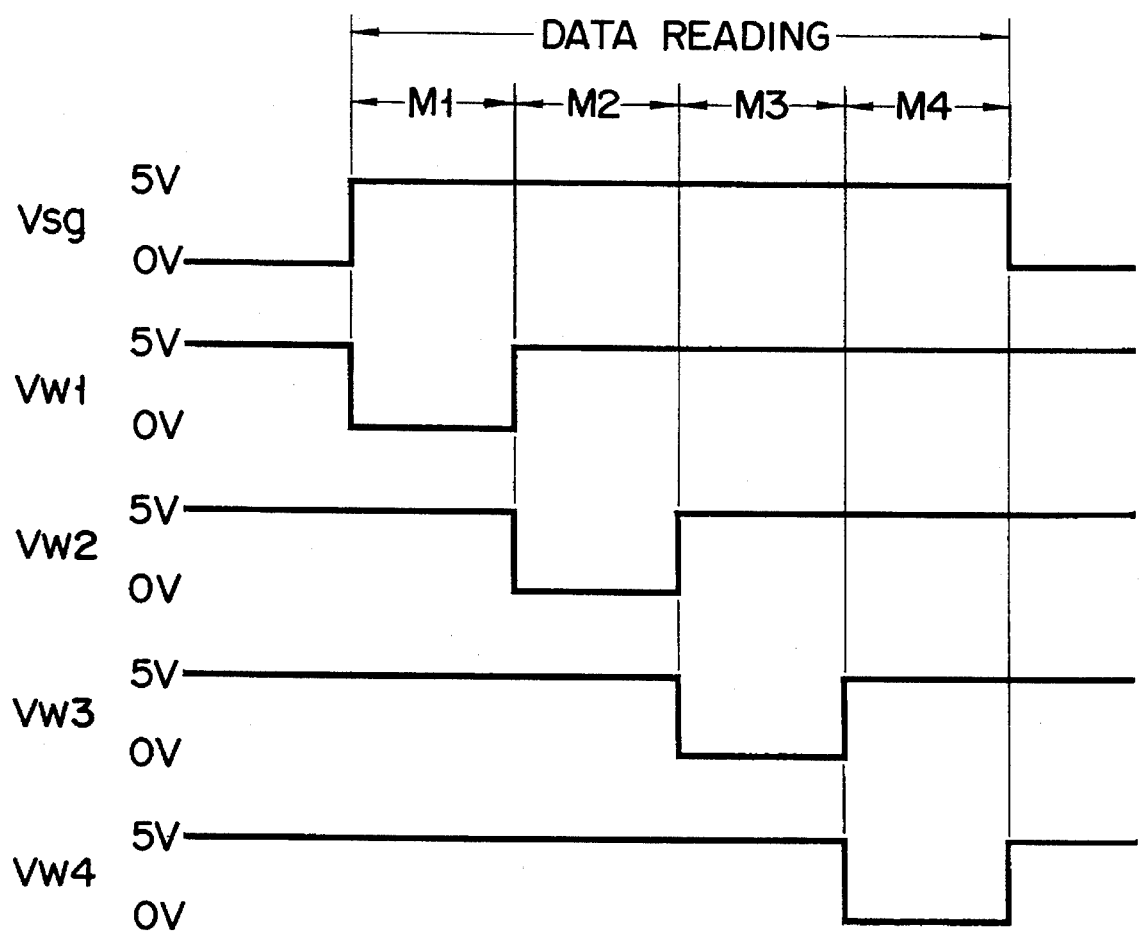
FIG. 8 is a diagram showing typical waveforms of voltage signals generated at the main parts of the EPROM in the data reading mode.

As shown in FIG. 8, in the data readout mode, the gate voltage Vsg of selection transistor Qs is set to 5 volts corresponding to a logic "1" level. The word line connected to the selected cell is impressed with a low voltage (0 volt), while word lines connected to the remaining nonselected cells are supplied with 5 volts. In other words, only the cell Mi that is connected to a word line impressed with 0 volt is selected. If a low voltage (0 volt) is applied, in turn, to the control gates of memory cell transistors M1, M2, M3 and M4 in the cell block B11 as shown in FIG. 8, then data will sequentially be read out from memory cells M1 to M4.

When word line WL11 is impressed with 0 volt, and hence the corresponding transistor M1 is selected, cell transistors M2 to M4 are turned on because the other word lines WL2, WL3 and WL4 are supplied with 5 volts. The selected cell transistor M1 is "off" under the condition that its threshold value is positive, while "on" under the condition that its threshold value is negative. Accordingly, whether or not a current flows through cell block B11 including the selected cell M1 is uniquely determined according to the data write condition. When cell M1 is selected, the detection of whether a current flows through cell block B11 or not will permit the discrimination of data stored in cell M1. The above principle for readout applies to the other cells M2 to M4.

With such an arrangement, the simultaneous erasure and selective write of data can be performed effectively. In particular, in the data write mode, by adopting such a distinctive technique of the voltage application as described above, it is possible to perform effective data writing/erasing operation with improved reliability. Moreover, in the specified cell block B11, memory cell M4 furthest from contact hole 30 is first written into, subsequently memory cells M3 and M2 are sequentially written into, and lastly memory cell M1 nearest contact hole 30 is written into. For this reason, the cell data, which has once been written into, can surely be prevented from being disappeared or erased during subsequent write operations. This also will contribute greatly to improved reliability of operation of the EEPROM. For example, after a logic "1" data is written into any one of memory cells M1 to M4, if a logic "0" data is written into memory cell M4, a certain cell included in cells M1 to M4 in which data "1" has been stored will be set forcibly to the data erasing mode and thus erased undesirably. Such undesirable phenomenon can be prevented by performing the data writing operation in the aforementioned, particular cell writing sequence.

It should be noted that the EEPROM may be modified to use memory cells of composite structure, each of which has a sectional structure shown in FIG. 9 wherein a second gate insulating layer 44 adapted for electrical isolation of floating gate 38 from control gate 42 has a stacked structure of a thermal oxide layer 44a, a silicon nitride layer 44b and a thermal oxide layer 44c. First gate insulating layer 40 has a thickness of 20 nanometers, whereas the stacked structure of layers 44a, 44b and 44c each has a thickness of 20 nanometers. With such an arrangement, each memory cell Mi can be formed such that the coupling capacitance Cfs is smaller than the coupling capacitance Cfc.

Referring to FIG. 10, the EEPROM according to a second embodiment of the present invention is characterized in the provision of an additional data buffer memory unit which has a capacity larger than that of a latch circuit and is adapted to temporarily store data entered into the latch circuit, in order to effectively perform page-mode data addressing.

As shown in FIG. 10, in essentially the same manner as the first embodiment, memory cell section 80 is associated with row decoder 82, sense amplifier 84 and column decoder 86. As shown in FIG. 11, memory cell section 80 comprises memory cells ML1, ML2, . . . placed at intersections of parallel bit lines BL1, BL2, . . . BLm (in this embodiment m=256) and parallel word lines WL1, WL2, . . . (where L constitutes for example the integers 1-4 as shown in the example of FIG. 11 (i.e. ML1 will be M11 at the intersection of BL1 and WL1, and ML2 will be M12 etc.). Memory cell transistors contained in a cell block Bi are series-connected to constitute a "NAND cell" structure like the above embodiment. The series array of cell transistors M1, M2, . . . , M4 has an end connected to the corresponding bit line BL1 via a first selection transistor Qs1. Sense amplifier section 84 is connected to bit lines BL to detect output voltages thereon. The series array of cell transistors M1, M2, . . . , M4 has the other end connected to a substrate potential Vs via a second selection transistor Qs2.

Latch circuit 88 is connected to column decoder 86 to temporarily store input data to cell section 80 or output data from cell section 80. Latch circuit 88 has a latch capacity corresponding to the (same) number of bit lines BL of cell section 80. This latch capacity may be less than the bit line number. For example, the capacity of latch circuit 88 may be reduced to ¼ the bit line number, if the data input operation is time-divided into four input sub-operations. Row address buffer unit 90 having address signal terminals 91 is connected to a row decoder 82, and column address buffer 92 having address signal terminals 93 is connected to column decoder 86. Input data is applied from an I/O line terminal to latch 88 via a data input buffer unit 94. Output data from latch 88 is fed to the I/O line terminal via I/O sense amplifier 96 and data output buffer unit 98.

A static random access memory (SRAM) 100 is additionally provided between data input buffer 94 and the latch 88. SRAM 100 has a larger memory capacity than the latch 88. In this embodiment, SRAM 100 has a memory capacity of 256×4 bits (the product of the number of bit lines BL and the number of memory cells M1 to M4 contained in each cell block Bi), or 1K bits. In other words, SRAM 100 has a static memory cell matrix with series arrays of static memory cells the number of which corresponds to the number of stages in a NAND cell (in this embodiment, four), each array having a page length corresponding to the number of bit lines BL.

Figure 12:
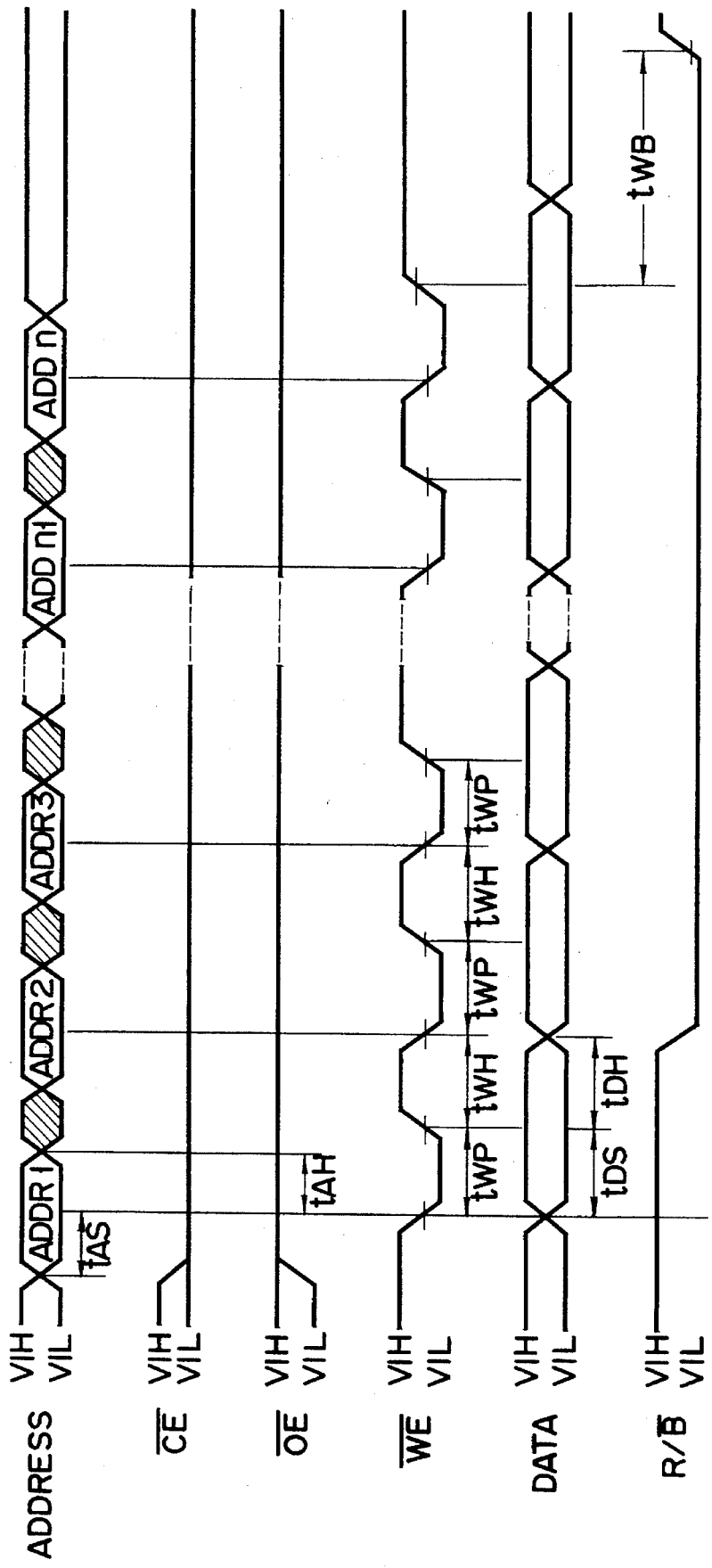
FIG. 12 is a diagram showing typical waveforms of voltage signals generated at the main parts of the EEPROM of FIG. 10 in the data writing mode.

The data addressing operation of the EEPROM in the page mode will be described with reference to a timing chart shown in FIG. 12. In this Figure, $\overline{CE}$ is a chip enable signal which enables the EEPROM when "L" (low). $\overline{OE}$ is an output enable signal which permits a write mode when "H" (high). $\overline{WE}$ is a write enable signal which goes from a "H" level to a "L" level to permit the entry of address data and goes back to "H" level to permit entry of input data. R/B is a Ready/Busy signal which is "L" during a write operation, informing the outside that the memory is in a write operation. Assume now that SRAM 100 is not provided in FIG. 10. By repeating a cycle of "H"→"L"→"H" of the write enable signal $\overline{WE}$ the number of times corresponding to one page (in this embodiment, the number of the bit lines, that is, 256), it is possible to enter data at high speed. The one-page data are stored in latch 88 connected to the bit lines. The latched data are transferred to the bit lines and written into memory cells designated by address data. The above is the well known page-mode operation. For example, to write 256-bit data without the use of the page mode, it will totally take 2.5 sec. under the condition that the erase time and the write time are 10 msec and 10 msec×256, respectively. When the page mode is used, on the other hand, it will take 20.2 msec each time it is required to enter 256 bits of data (=1 μsec×256)+the erase time (10 msec). This results in an about 125-fold increase in the data entry speed.

With this embodiment, as shown in FIG. 10, SRAM 100 is provided in addition to latch 88. As described above, SRAM 100 has a capacity of one page (256)×the number of stages of NAND cells (4), that is, 1K bits. It is possible to randomly write data into any of addresses of SRAM 100 by the use of the page mode. That is, first, the cycle "H"→ "L"→"H" of the write enable signal WE is repeated 256×4 times so as to enter the 1K-bit data into SRAM 100. One-page data of M41, M42, . . . , M4n (n=256) in the data entered into SRAM 100 are first transferred to latch 88. The transferred one-page data are simultaneously written into 256 memory cells along word line WL4 of FIG. 11 in accordance with the above-described operational principle. Subsequently, one-page data of M31, M32, . . . , M3n are transferred from SRAM 100 to latch 88 to be simultaneously written into 256 memory cells along word line WL3. In this way, 1K-bit data stored in SRAM 100 are in succession written into latch 88.

In the page mode without the provision of SRAM 100, as described above, it takes 20.2 msec to write one-page data and 20.2 (msec)×4=80.4 (msec) to write 1K bits. With the embodiment provided with SRAM 100 of 1K-bit capacity, on the other hand, the time required to write 1K bits in the page mode is a time required to enter 256 pieces of external data (1 μsec×256)+an erase time (10 msec)+a write time (10×4) 50.2 msec. (It is to be noted in this connection that the data erase has only to be performed once.) That is, because of the provision of SRAM 100 about 62% reduction in the write time can be attained.

As described above, the present embodiment can provide a highly reliable EEPROM by means of the NAND structure of memory cells which perform the write and erase operations on the basis of tunnel current between the substrate and the floating gate as in the case of the above embodiment. Further, by the provision of a buffer SRAM having a capacity larger than one page in addition to a latch circuit, it is possible to speed up the data write in the page mode.

With the above embodiments, four memory cells are series connected to constitute a NAND cell. However, the number of memory cells to constitute the NAND cell is not restricted to four. The increase in the number of memory cells in a NAND cell will result in a higher speed in data write in the page mode. Eight memory cells will result in an increase in the data write speed. This is due to the amount of buffering that occurs and consequently the increase in the number of memory cells increases the data writing speed. The provision of a buffer memory for output data will also be useful.

Figure 13:
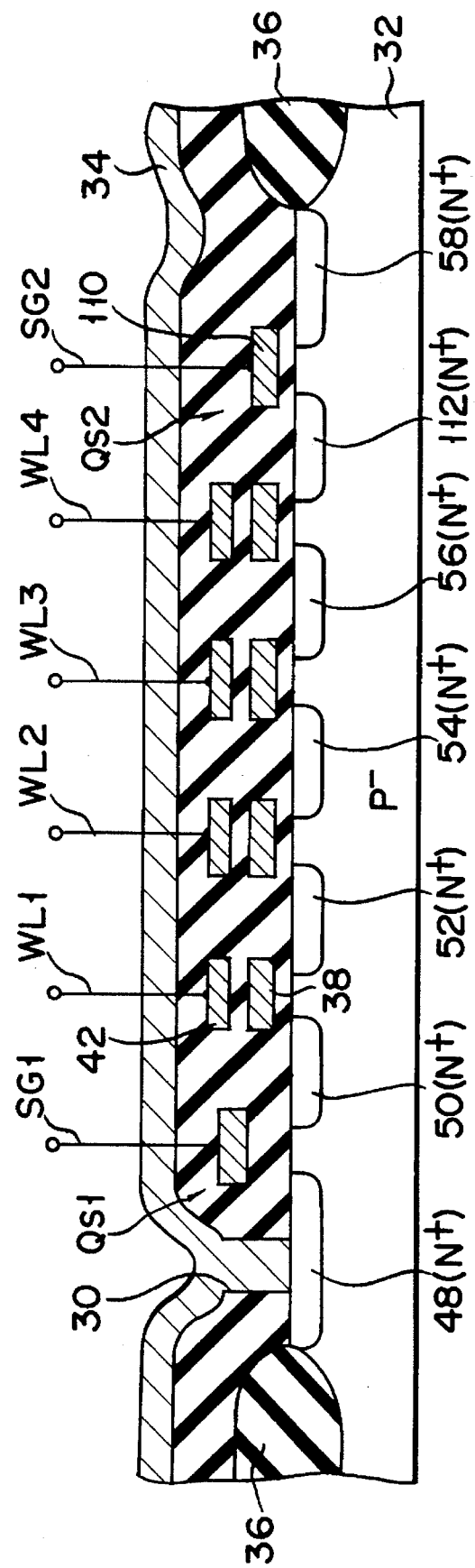
FIG. 13 is a diagram showing a cross-sectional view of a NAND cell block which is included in the memory cell matrix shown in FIG. 11 and which has two selecting transistors.

Another important feature of the second embodiment is the provision of two selecting transistors Qs1 and Qs2 in each cell block Bi. As a typical example, a longitudinal section of cell block B1 is shown in FIG. 13. In this Figure like reference numerals are used to designate like portions in FIG. 4 of the first embodiment and the detailed descriptions thereof are excluded. For convenience of description, however, wiring lines connected to first and second selecting transistors Qs1 and Qs2 are denoted by "SG1" and "SG2", respectively. As shown in FIG. 13, selecting transistor Qs2 is formed of a conductive layer 110 disposed over substrate 32 and serving as a gate, and heavily-doped N type diffusion layers 58 and 112 formed in the surface portion of substrate 32 to be self-aligned with gate 110. N+ layer 58 is connected to the substrate potential (ground potential) Vs.

Second selecting transistor Qs2 is provided to prevent the creation of any current flow path in the NAND cell array even when the threshold voltage level of a data-written cell is shifted. If the threshold voltage level is shifted in such cell in which data is stored, the current flow path can be prevented from being created by rendering second selecting transistor Qs2 nonconductive and causing the NAND cell array to be electrically separated from the chip substrate voltage. Second selecting transistor Qs2 may be rendered nonconductive in synchronism with first selecting transistor Qs1, if desired.

As shown in FIG. 14, which is an alternative embodiment of the invention, when the EEPROM is in the simultaneous erasing mode, first and second selecting transistors Qs1 and Qs2 each have its gate supplied with a gate control signal of a "L" level (0 volt). Thus, selecting transistors Qs1 and Qs2 are rendered nonconductive so that the series arrays of cell transistors M1 to M4 in the cell block B1 are electrically isolated from corresponding bit line BL1. In other words, N+ diffusion layers 48, 50, 52, 54, 56, 58 and 112 for the drains and sources of NAND cell transistors M1 to M4 are all electrically floated, and the connection to the substrate potential Vs is completely inhibited. Under such a condition, the same simultaneous erasing operation ("flash erasing") as in the first embodiment is performed. With such an arrangement, an erroneous erasure in the simultaneous erasing mode can effectively be avoided. The reason is as follows.

The threshold value of a memory cell after erasure must be lower than a "1" level voltage applied to the control gate of a nonselected memory cell when data is to be read out. On the other hand, the threshold value of a memory cell after write should be as low as possible in order to improve the sense sensitivity. As with the present invention, if the drain and source of a NAND cell are kept floated in the erasing mode, then no injection of electrons from the drain and source in which the electron density is high into the floating gate will occur. For this reason, the amount of electrons injected into the floating gate is little as compared to the case where the drain and source are grounded, and the variation in the threshold value can be small.

In the subsequent data write mode, as shown in FIG. 14, when the EEPROM is in the data write mode, first and second selecting transistors Qs1 and Qs2 each have its gate supplied with the gate control signal of a "H" level (23 volts). Thus, selecting transistors Qs1 and Qs2 are rendered conductive so that the series arrays of cell transistors M1 to M4 in the cell block B1 are connected to corresponding bit line BL1 and substrate potential Vs. Under such a condition, the same write operation as in the first embodiment is performed.

It should be noted that the "H" level of the gate control signal applied to selecting transistors Qs1 and Qs2 and the "H" level of the voltage Vwi applied to each of word lines connected to a nonselected cell or cells are each raised to 23 volts. This value is the sum of the bit line voltage Vbit and the threshold value of memory cell M1 under the erase condition. In the interval between t2 and t3, memory cell is first selected by applying a "L" level voltage to word line WL4 only. At this time, the "H" level voltage Vbit is applied to corresponding bit line B1. Under such circumstances, the "H" level voltage is transferred to drain layer 56 of selected cell M4 via selecting transistor Qs1 and memory cells M1 to M3. In memory cell M4, a high electric field is produced between its control gate 42 and substrate 32. As a result, electrons accumulated at floating gate 38 of cell M4 are discharged to substrate 32 because of the tunnel effect. The threshold value of cell transistor M4 is thus shifted to a negative level (e.g. −2 volts). This state corresponds to the logic "1" data having being written into cell M4. During this interval, in each of nonselected cell transistors M1 to M3, since no electric field is applied between the control gate and substrate, the erase condition is held. In the data-writing to cell M4, if "L" level voltage Vbit is applied to bit line B1, data may be kept unchanged, which means the writing of logic "0" data. That such a data write operation is performed in the order of memory cells M4, M3, M2 and M1, namely, in the order of distance from contact hole 30 and hence bit line BL1, beginning with cell M4 furthest from the contact hole is essentially the same as the previous embodiment.

In the data read mode, first and second selecting transistors Qs1 and Qs2 each have its gate supplied with the gate control signal of a "H" level (23 volts). Thus, selecting transistors Qs1 and Qs2 are rendered conductive so that the series arrays of cell transistors M1 to M4 in the cell block B1 are connected to corresponding bit line BL1 and substrate potential Vs. For example, to read from memory cell M3, a "L" level voltage (0 volt) is applied to word line WL3 connected to memory cell M3, whereas a voltage is applied to word lines WL1, WL2 and WL4 connected to nonselected cells M1, M2 and M4, the voltage being so high (i.e. 20 volts or higher) as to turn these cell transistors on. By detecting whether a current flows in cell block B1 or not, it becomes possible to determine whether the data stored in selected cell M3 is logic "1" data or logic "0" data.

Figure 15:
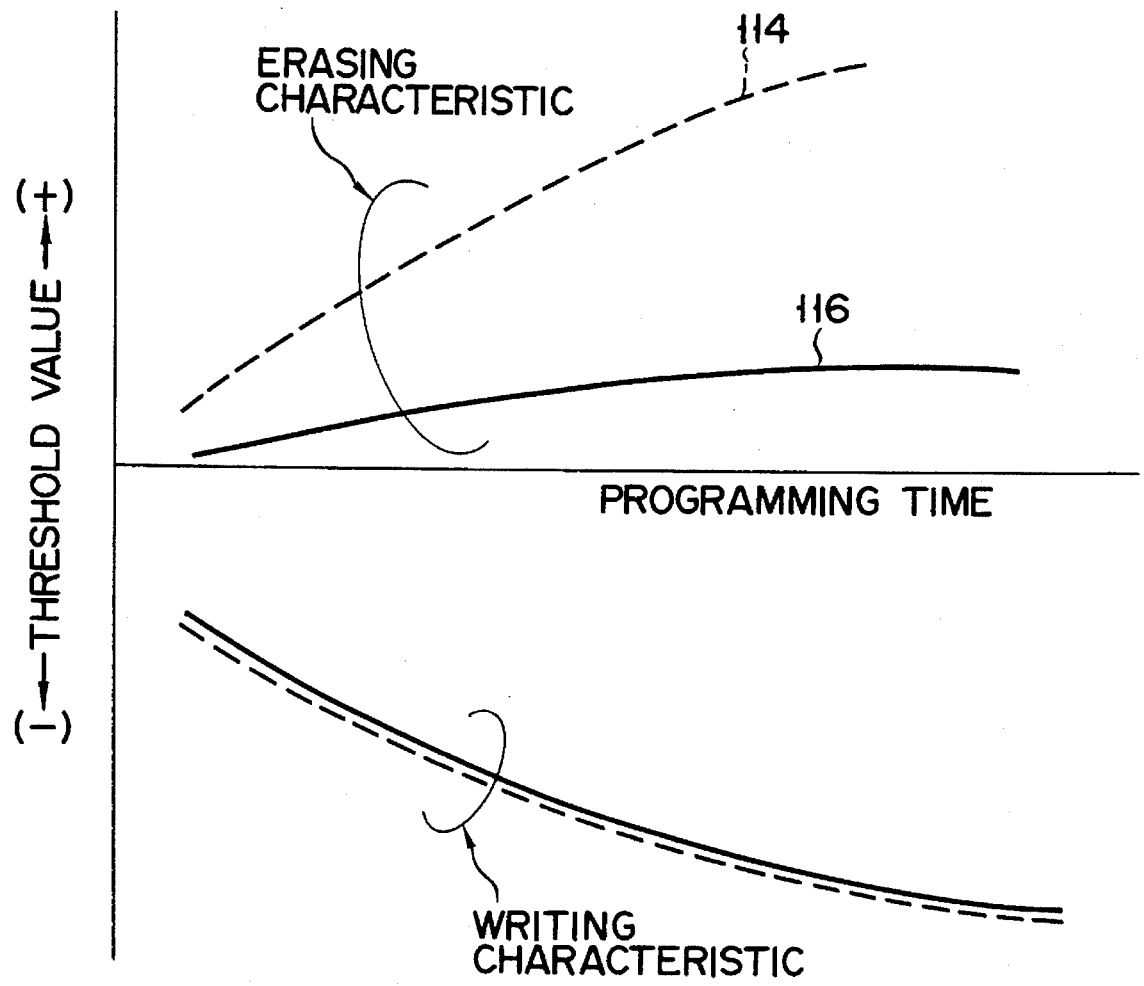
FIG. 15 is a graph showing the erasing characteristic and the writing characteristic of the EEPROM.

FIG. 15 shows the erase and write characteristics of NAND cell block Bi in the EEPROM of the present embodiment, in which solid lines represent the measured data of the embodiment of the present invention, whereas broken lines represent the measured data of a comparable device with no second selection transistor Qs2 which is turned off in the erase mode, thereby electrically isolating cell block Bi from substrate potential Vs. The embodiment device and the comparable device are the same in the write condition. As will be apparent from the measured graphs, the erasing characteristic of the comparable device greatly varies in the positive direction as shown by broken line 114. This great variation is due to the injection of electrons from the sources and drains of the NAND cell array. To the contrary, the variation of the erasing characteristic of the embodiment device is small in the positive direction as shown by solid line 116.

According to the present embodiment, in the simultaneous erase mode, by forcefully electrically isolating a specified cell block from the substrate potential Vs to bring it into the electrical floating condition, it is possible to permit the injection of electrons only from an inverted layer of the substrate surface and prevent the injection of electrons from the sources and drains of a NAND cell array. For this reason, the positive shift of the cell threshold value can be minimized. Therefore, since the cell threshold value in the "0" condition is maintained relatively low, a voltage applied to the control gate of a nonselected cell at a time of readout can be lowered. The erroneous erasure, which is liable to occur when the control gate voltage in a nonselected cell becomes high for readout, can effectively be prevented. This means that the simultaneous erasing operation of the present invention is highly reliable.

Figure 16:
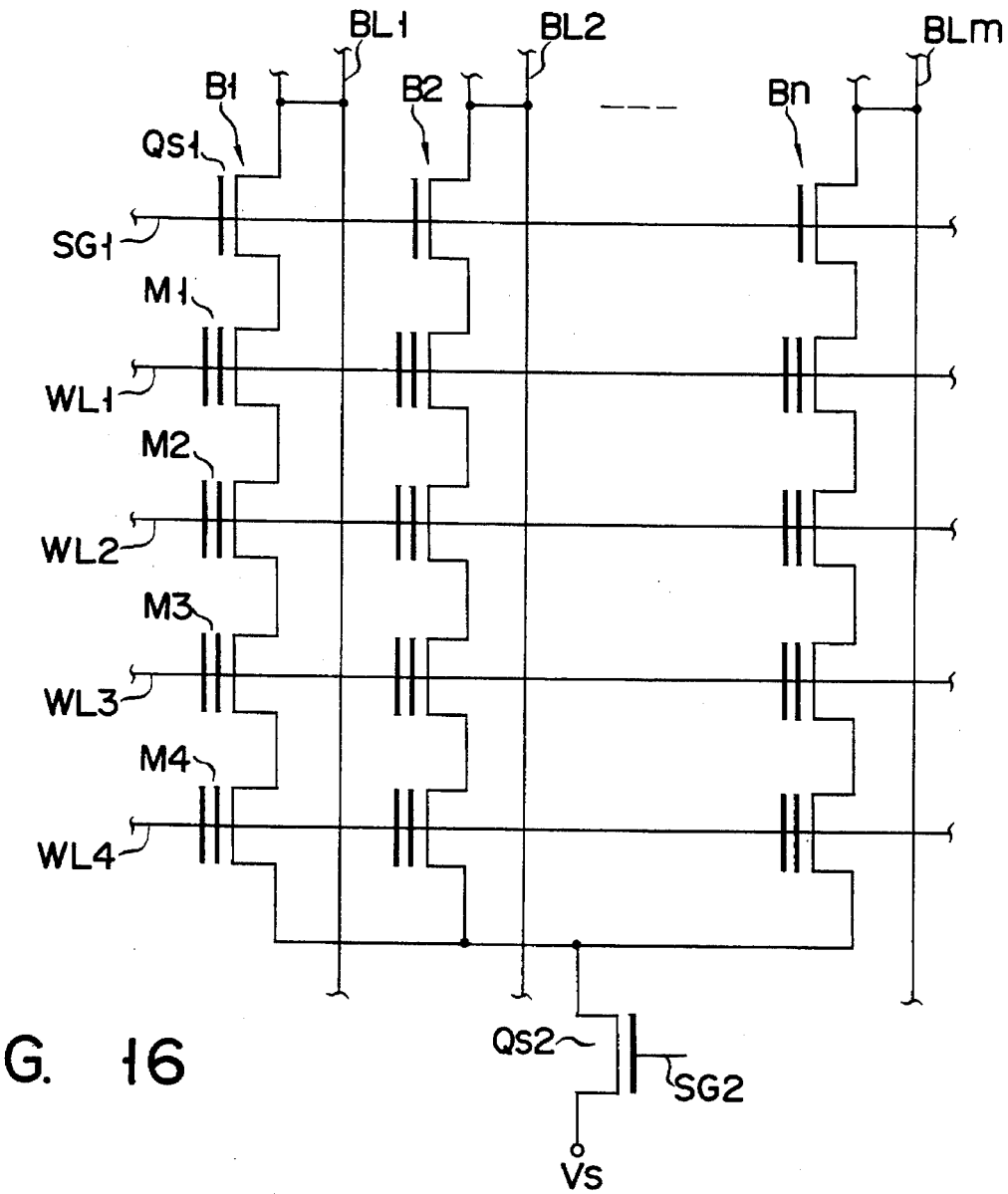
FIG. 16 is a diagram showing a partial memory cell matrix arrangement of a modification of the second embodiment device.
Figure 17:
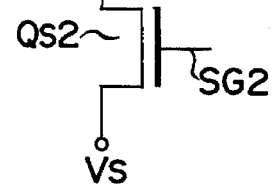
FIG. 17 is a diagram showing typical waveforms of voltage signals generated at the main parts of the modified EEPROM in the data erasing mode.
Figure 17:
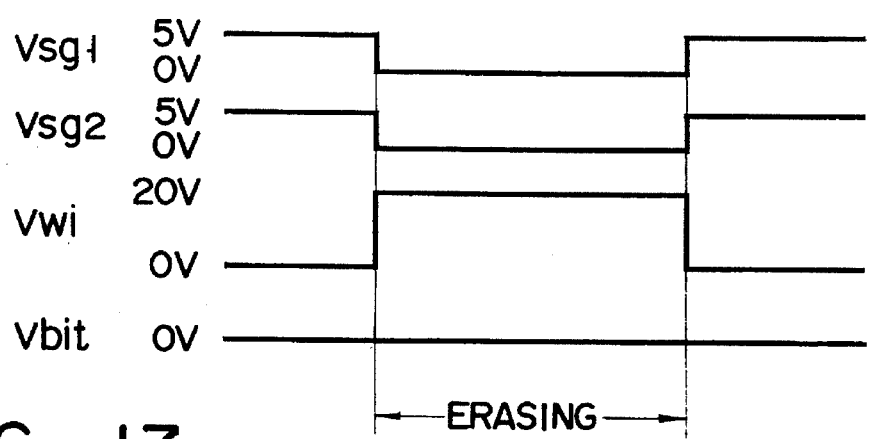

As shown in FIG. 16, second selecting transistor Qs2 may be modified to be common to NAND cell blocks B1, B2, . . ., Bn connected to bit lines BL. With such an arrangement, in the erase mode, selecting transistor Qs1 of each NAND cell block Bi and common selecting transistor QS2 are simultaneously supplied with a "L" level voltage (0 volt) as shown in FIG. 17 and thus rendered nonconductive. In this case also, the same advantage as the above will be obtained.

Figure 18:
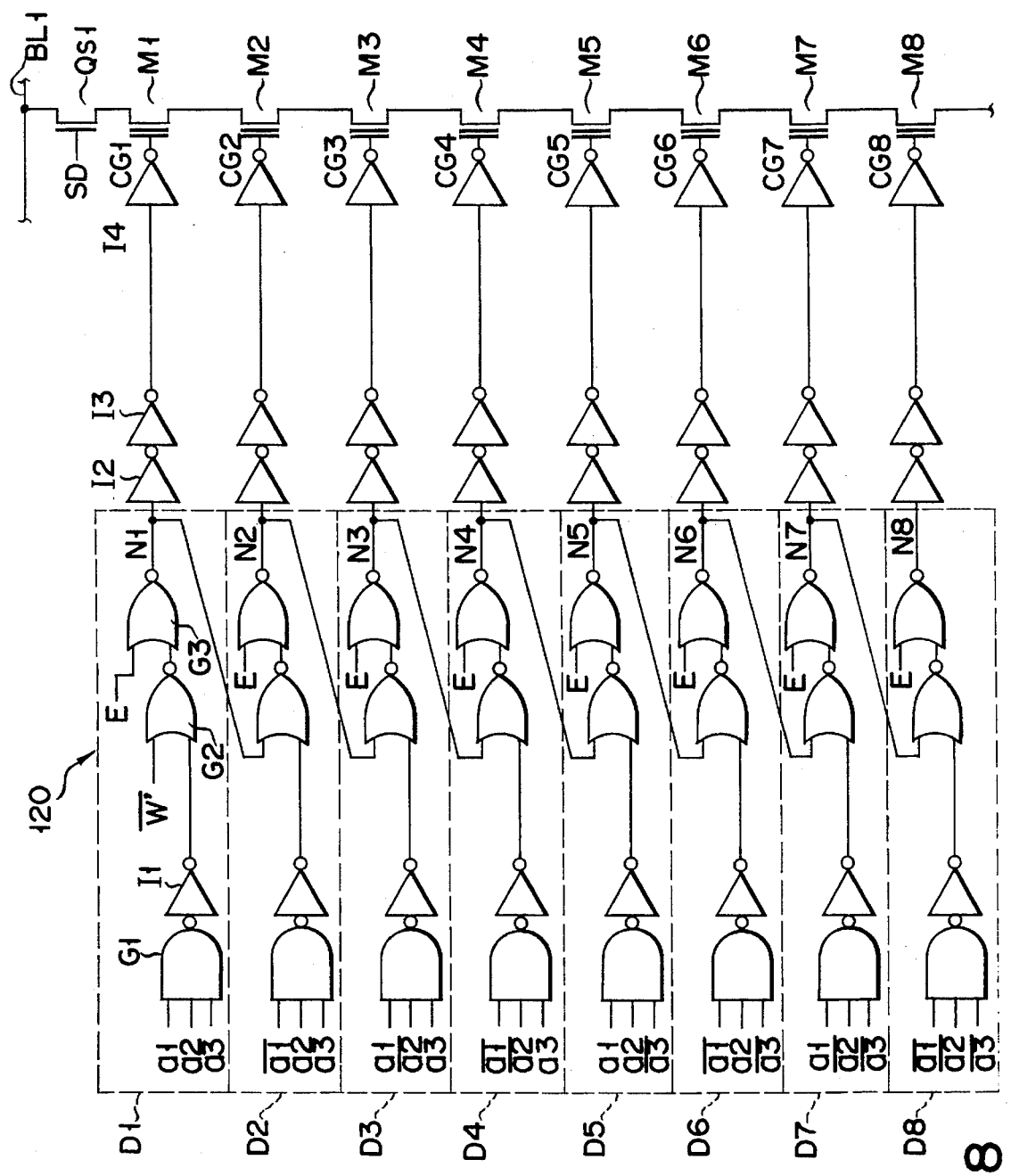
FIG. 18 is a diagram showing a decoder circuit configuration preferably utilized for a decoder circuit provided in the EEPROMs in accordance with the embodiments of this invention.

A practical peripheral circuit arrangement 120 well adapted for row decoder unit 16 or 82 is shown in FIG. 18. In this arrangement the number of memory cells included in each NAND cell block Bi is chosen to be eight. In this case, each NAND cell array has cell transistors M1 to M8 as shown in FIG. 19.

As shown in FIG. 18, decoder circuit 120 includes eight 1-bit decoders D1 to D8 to accommodate 8-bit NAND cell block Bi (e.g. B1). Decoders D1 to D8 specify any one cell transistor among cell transistors M1 to M8 in NAND cell array B1. Each decoder Di comprises a 3-input NAND gate G1, an inverter I1, and a series circuit of 2-input NOR gates G2 and G3. The output node Ni of each decoder Di is connected to the control gate CGi of a corresponding memory cell transistor Mi through inverters I2, I3 and I4. 3-input NAND gate G1 has inputs connected to receive address data a1, a2 and a3. Each piece of the address data has a logic "1" level or a logic "0" level. A combination of logic "1" and "0" levels in the address data causes one of inverters I1 of decoders D1 to D8 to produce a logic "1" level signal.

In each decoder Di, NOR gate G2 is supplied with an output signal of inverter I1 and a write control signal W'. NOR gate G3 is supplied with an output signal of NOR gate G2 and an erase control signal E. Output node N1 of first stage decoder D1 is connected to one input of NOR gate G2 in second stage decoder D2 to provide a write signal. An output signal of each decoder Di is fed to control gate CGi of corresponding cell transistor Mi through a cascade connection of three inverters I2, I3 and I4.

To write into cell block Bi shown in FIG. 19 by using decoder circuit 120 arranged as above, address data a1, a2 and a3 is first applied to decoder circuit 120 externally. Here it is assumed that, as exemplarily depicted in FIG. 20, address data a1 and a2 have a logic "H" level, whereas address data a3 has a logic "L" level. Write control signal W' goes to a logic "L" level. Erase control signal E goes to a logic "L" level before write control signal W changes in its level.

Since address data a3 is low, decoder D1 is not selected so that an output signal of a logic "H" level is produced at output node N1. The output signal is fed through inverters I2, I3 and I4 to cell transistor M1, causing its control gate CG1 to go to a "H" level. The output signal of decoder D1 is applied to NOR gate G2 of subsequent decoder D2.

As shown in FIG. 18, decoder D2 is supplied with address data a1, a2 and a3 so that the decoder is not selected, thus producing at its output N2 an output signal of a "L" level. Therefore, the control gate CG2 of cell transistor M2 goes high. The output signal of decoder D2 is further applied to succeeding decoder D3. Similarly, decoder Di is supplied with the output signal of preceding decoder Di-1 and its own input address data. All the decoders produce an output signal with a logic "L" level until a selected memory address is reached.

According to the above example, decoder D5 is supplied with address data a1, a2 and a3 whose levels are all high ("H" level), and the decoder D5 is brought into the selected condition. At this time, since the potential of output node N4 of preceding decoder D4 is low ("L" level), the potential of output node N5 of decoder D5 is high ("H" level). Next, although decoder D6 is not selected, its output node N6 is high in potential because a "H" level output signal of preceding decoder D5 is applied to NOR gate G2 of decoder D6 as a write control signal. The same applies to output nodes N7 and N8 of succeeding decoders D7 and D8.

In this way, as shown in FIG. 20, control gates CG1 to CG4 of memory cells M1 to M4 disposed on the side of the drain of the selected memory cell M5 are all supplied with the "H" level signal, whereas control gate CG5 of memory cell M5 and control gates CG6 to CG8 of memory; cells disposed on the side of the source of the selected cell M5 are all supplied with the "L" level signal. When bit line BL is supplied with a "H" level signal, the channels of memory cells M1 to M4 conduct, and a high electric field is applied between the control gate and the substrate of each of memory cells M1 to M4. As a result, electrons accumulated at the floating gate are discharged to the substrate by means of the tunnel effect, thereby writing "1" data into memory cells M1 to M4. In memory cells M6 to M8 disposed on the side of the source of the selected memory cell M5, no electric field is applied between the control gate and the substrate with the result that data which has already been written into will never be destroyed.

In decoder circuit 120 of FIG. 18, when erase control signal E is rendered high, output nodes N1 to N8 of the decoders D1 to D8 go to the "L" level and hence control gates CG1 to CG8 of memory cells M1 to M8 are supplied with the "H" level. Under this condition, when bit line BL1 is rendered low ("L"), electrons are injected from the substrate into the floating gate in each of the memory cells M1 to M8, effecting the total erasure.

Decoder circuit 120 can be modified as shown in FIG. 21. The modified decoder circuit 130 is arranged to make a comparison between reference address signals v0, v1, v2, v3 and input address data a1, a2, a3, and to, in accordance with the comparative result, apply a "H" level voltage to a control gate or gates of a memory cell or cells disposed on the drain of the selected memory cell transistor Mi and apply a "L" level voltage to a control gate of the selected memory cell transistor Mi and a control gate or gates of a memory cell or cells disposed on the source side of the selected memory cell transistor Mi. In this example, subtraction is used for the comparison between each of the input addresses a1, a2, a3 and a corresponding reference address v1, v2, v3. The subtraction of binary numbers is performed by addition of the "twos complement" of a minuend. Accordingly, the reference address v0, v1, v2, v3 is formed in "twos complement" as shown in the following table.

|     | v0 | v1 | v2 | v3 |
| --- | --- | --- | --- | --- |
| CG1 | 0 | 0 | 0 | 0 |
| CG2 | 1 | 1 | 1 | 1 |
| CG3 | 1 | 1 | 1 | 0 |
| CG4 | 1 | 1 | 0 | 1 |
| CG5 | 1 | 1 | 0 | 0 |
| CG6 | 1 | 0 | 1 | 1 |
| CG7 | 1 | 0 | 1 | 0 |
| CG8 | 1 | 0 | 0 | 1 |

The thus formed twos complement reference address is used for addition to the input address data.

It is to be noted that only a relationship in magnitude between the reference address and the input address is of importance, and no attention needs be paid to the calculation result itself. Thus, attention should be paid to a carry generating section of an adder circuit. The least significant bit a1 of the input address and the least significant bit v3 of the decoder address are applied to a carry generating section of a half-adder. The output of the half-adder, the next significant bit a2 of the input address and the next significant bit v2 are applied to a carry generating section of a full adder. Similarly, a carry generating section of a full adder is used to determine the level of control gates CG1 to CG8.

It is now assumed that memory cell M5 is to be written into as in the previous embodiment. At this time, the input address will be a1="H", a2="H", a3="L". This is regarded as a three-place binary number "001" for addition to the decoder address v1, v2, v3. As a result of addition, a "H"

level voltage is applied to control gates CG1 to CG4, while a "L" voltage is applied to control gates CG5 to CG8. By the way, v0 is used to detect whether a carry resulting from the calculation up to the most significant bit is positive or negative.

FIG. 22 shows an arrangement of decoder circuit 140 according to still another embodiment. The input address (a1, a2, a3) can provide eight combinations: (0, 0, 0); (0, 0, 1); (0, 1, 0); (0, 1, 1); (1, 0, 0); (1, 0, 1); (1, 1, 0); and (1, 1, 1). The decoder gate circuit is arranged to apply the "H" level to predetermined outputs CG1 to CG8 for each of the combinations of the input address. W is a write control signal, and E is an erase control signal. To write into, W="H" and $\overline{E}$="H". Under this condition, if (a1, a2, a3)=(0, 0, 0), then CG1 to CG7="H" and CG8="L", so that memory cell M8 is selected. When (0, 0, 1), CG1 to CG6="H" and CG7, CG8="L", so that memory cell M7 is selected. When (0, 1, 0), CG1 to CG5="H" and CG6 to CG8="L", so that memory cell M6 is selected. When (0, 1, 1), CG1 to CG4="H" and CG5 to CG8="L", so that memory cell M5 is selected. When (1, 0, 0), CG1 to CG3="H" and CG4 to CG8="L", so that memory cell M4 is selected. When (1, 0, 1), CG1 to CG2="H" and CG3 to CG8="L", so that memory cell M3 is selected. When (1, 1, 0), CG1="H" and CG2 to CG8="L", so that memory cell M2 is selected. Finally, when (1, 1, 1), CG1 to CG8="L", so that memory cell M1 is selected.

Figure 23:
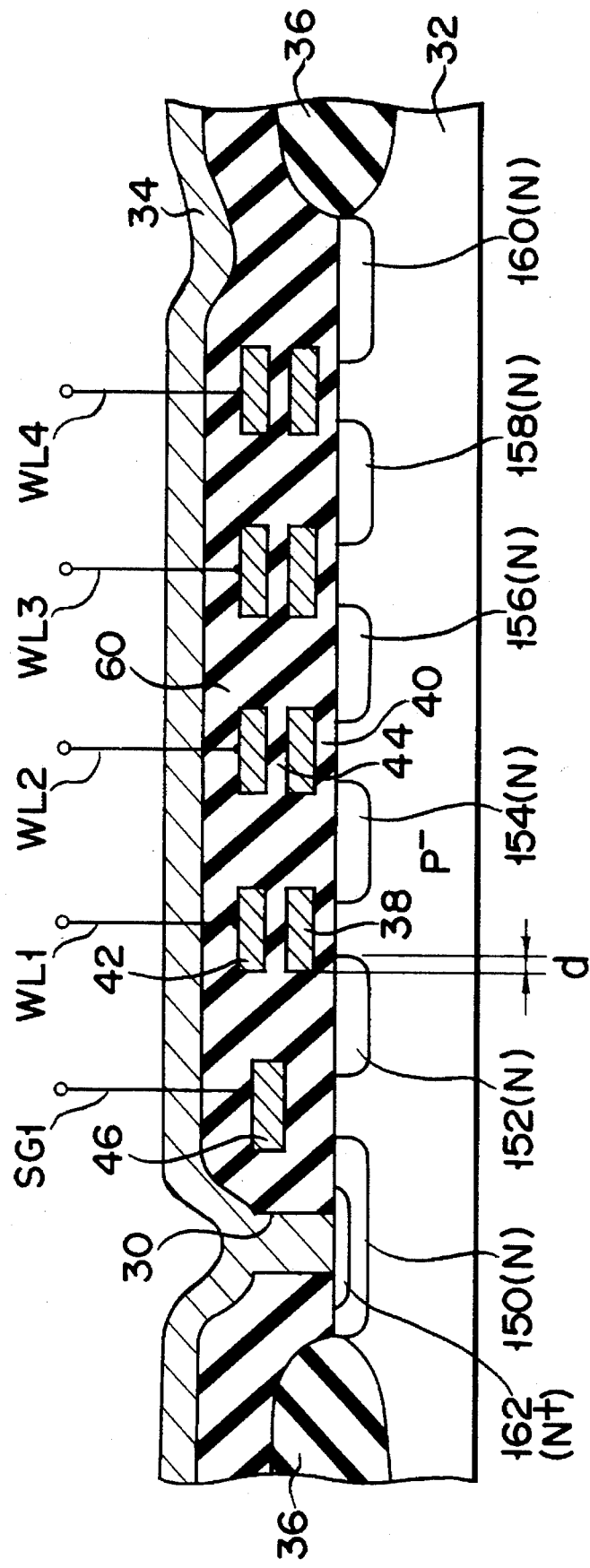
FIG. 23 is a diagram showing a cross-sectional view of a NAND cell block of an EEPROM in accordance with the present invention.

In FIG. 23 is shown a sectional view taken along the longitudinal direction of a NAND cell block of an EEPROM according to a third embodiment. In this Figure, like reference numerals are used to denote like portions in FIG. 4 and the detailed description thereof will be omitted.

N type diffusion layers 150, 152, 154, 156, 158, 160 are formed in the top surface area surrounded by device-isolation insulating layer 36 over substrate 32 as shown in FIG. 23. These diffusion layers serve as the sources and drains of adjacent cell transistors Mi and Mi+1 as in the previous embodiments. In N type layer 150 connected to aluminum strip 34 through contact hole 30, heavily-doped N type diffusion layer 162 is formed, thereby lowering ohmic contact resistance. Diffusion layers 150, 152, 154, 156, 158 and 160 serving as the sources and drains of NAND cell transistors M1 to M4 have a lower impurity concentration than the source and drain diffusion layers of transistors constituting peripheral circuits.

A method of manufacture of the NAND cell transistor array will be described. A thermal oxide layer 40 of a thickness of 5–20 nanometers is deposited over substrate 32 to provide a first gate insulating layer. On gate insulating layer 40 polysilicon layers 38 of 200–400 nanometers are formed to serve as floating gates of cell transistors M1 to M4. A thermal oxide layer 44 is deposited over layers 38 to a thickness of 15–40 nanometers to provide a second gate insulating layer. Over second gate insulating layer 44 are formed polysilicon layers 42 of 200–400 nanometers which serve as the control gates of selecting transistor Qs1 and cell transistors M1 to M4. Control gate layers 42 of cell transistors M1 to M4 form parallel word lines W1.

It should be noted that control gate layer 42 is formed after the etching-patterning process of floating gate layer 38 of each memory cell transistor Mi in NAND cells neighboring along the channel width direction, and that floating gate layer 38 and control gate layer 42 of each cell transistor Mi are simultaneously patterned using the same etching mask with respect to the direction of its channel. As a result, in each transistor Mi, the floating gate and the control gate are self-aligned with each other. Source and drain diffusion layers 150, 152, 154, 156, 158, 160 are formed by implanting N type impurities (e.g. phosphorus) into substrate 32 at an accelerating voltage of 40 KV and at a dosage of $7\times10^{14}$/cm$^2$ using gate layers as a mask. A peak value of impurity concentration in these diffusion layers is set below $10^{12}$/cm$^3$. These diffusion layers are formed by a process separate from a fabrication process for the source and drain layers of transistors in peripheral circuits of the EEPROM. In each of cell transistors M1 to M4 of the thus formed NAND cell, the source and drain diffusion layers (for example, layers 152 and 154 in cell transistor M1) overlap floating gate layer 38 by a distance of d. This distance d is below 0.5 micrometer.

A surface area of diffusion layer 150 contacting contact hole 30 is doped with arsenic, for example, by means of ion implantation to form an N+ layer 162 therein. In this example, the conditions of the ion implantation are such that an accelerating voltage is 100 KV and a dosage is $5\times10^{15}$/cm$^2$. A thermal process for activation of impurities after ion implantation is performed about 30 minutes at 950° C. in an N2 gaseous atmosphere.

According to the present embodiment, since the sources and drains of transistors constituting an NAND cell array are formed of lightly-doped diffusion layers, the occurrence of junction breakdown can be minimized even when the drain layers are supplied with a high reverse voltage in the write mode of the EEPROM. Further, in each cell transistor, the withstand voltage between floating gate 38 and corresponding diffusion layers can be elevated, thereby improving the data write margin. In addition, if the impurity concentration in silicon substrate 32 is increased as the impurity concentration in the source and drain diffusion layers decreases, then the NAND cell array will be protected from the adverse influence of parasitic field effect transistors.

Figure 24:
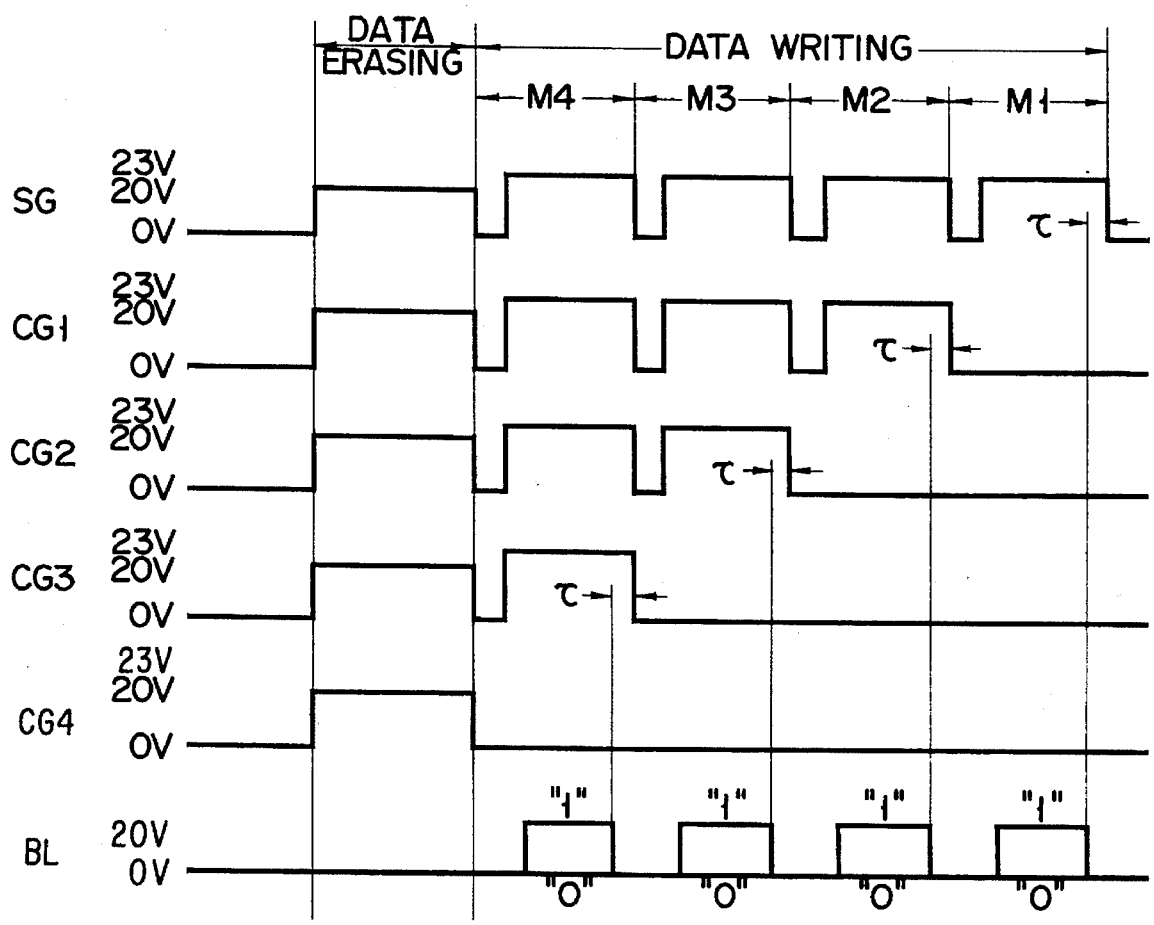
FIG. 24 a diagram showing typical waveforms of voltage signals generated at the main parts of the EEPROM in the data erasing mode and the data writing mode.

In the above embodiments, the control voltage application scheme in the write mode may be modified as shown in FIG. 24 in which "SG" stands for a gate voltage to the selecting transistor, "CGi" a control gate voltage to NAND cell transistor Mi (the most basic example is shown in FIG. 4) and "BL" a potential on a corresponding bit line.

As shown in FIG. 24, in order to first write into memory cell M4 in the data write mode, the voltage (selecting gate voltage) on gate SG of selecting transistor SG and the voltages (word line voltages) on control gates CG1 to CG4 of cell transistors M1 to M4 are temporarily set to ground potential (0 volt). The control gate voltage (CG4) of the selected cell transistor M4 remains fixed at the ground potential, and the control gate voltages (CG1 to CG3) of the other cell transistors M1 to M3 are changed to a "H" level (23 volts). This causes data to be written into memory cell M4.

After memory cell M4 has been written into, the voltage on the corresponding bit line falls to a logic "0" level before the control gate voltage (CG3) fails to the ground potential to select the next memory cell M3. The time difference is represented by "τ" in FIG. 24. The voltage on the selecting gate SG also is changed from a "H" level (23 volts) to a "L" level (0 volt) following a change in the control gate voltage (CG3) from a high level to ground. Similarly, after memory cell M3 has been written into, the voltage on the corresponding bit line BL is forced to a logic "0" level before the control gate voltage (CG2) is dropped to the ground potential to select the next memory cell M2. After memory cell M2 has been written into, the voltage on the corresponding bit line BL is at a logic "0" level before the control gate voltage (CG1) is dropped to the ground potential to select the last memory cell M1.

With such an arrangement, in the interval t prior to selection of memory cell Mi, a node between the selected cell transistor Mi and the adjacent cell transistor Mi+1 can be set to a low potential. Thus, a variation in the threshold value of memory cells can be suppressed, improving the stability and reliability of operation to write data into each memory cell Mi.

Figure 25:
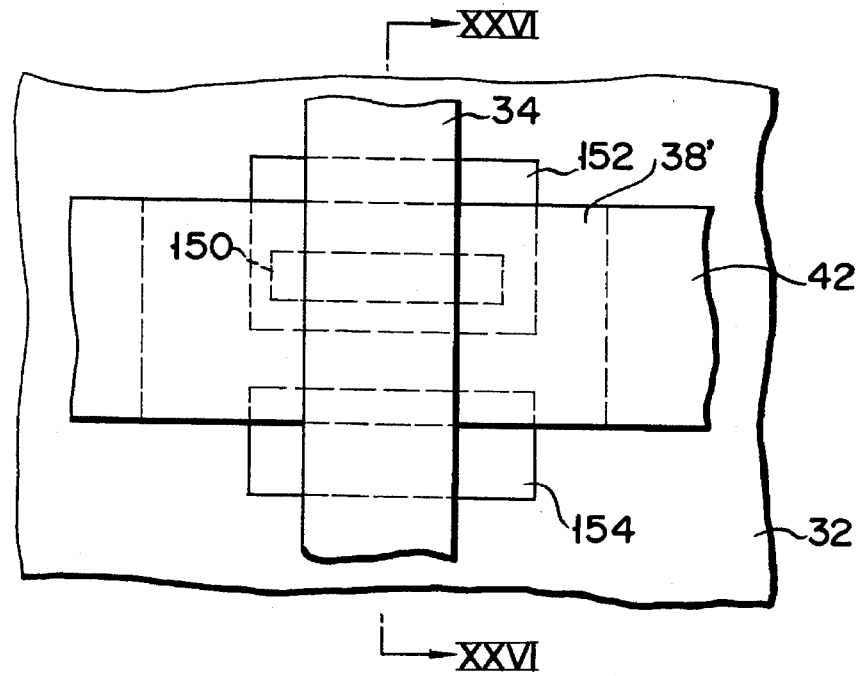
FIG. 25 is a diagram showing a partial plan view of a modification of a NAND memory cell transistor which may be used for the EEPROMs in accordance with this invention.

Each NAND cell transistor Mi in the above embodiments may be modified to have a sectional structure as shown in FIGS. 24 and 25 in which typically memory cell M1 is shown. In these Figures, like reference numerals are used to denote like portions in FIG. 4 or FIG. 23, and the detailed description thereof will be excluded.

Figure 26:
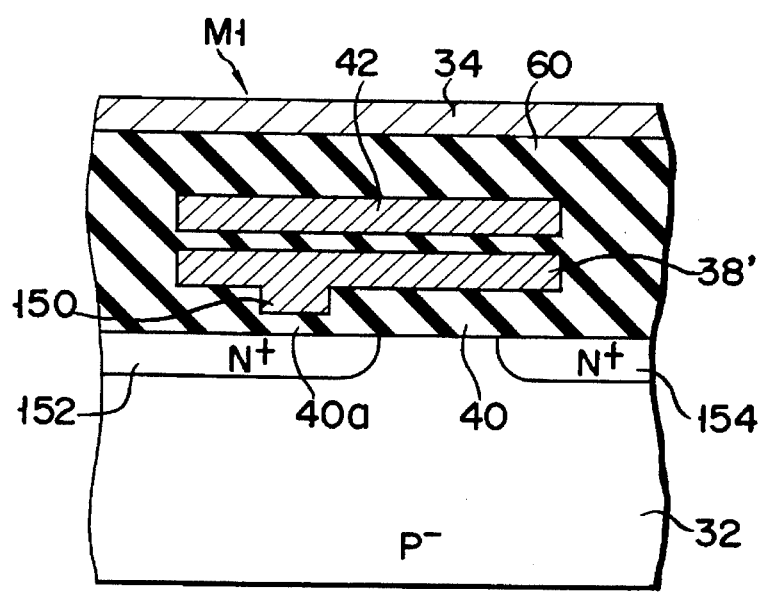
FIG. 26 is a diagram showing a cross-sectional view of the memory cell transistor of FIG. 25 taken along line XXVI—XXVI.

According to the modification, floating gate layer 38' has a protrusion 150 on its bottom surface with the result that first gate insulating layer 40 sandwiched between substrate 32 and floating gate 38' is partly made thin as shown in FIG. 26. N+ drain and source diffusion layers 152 and 154 of cell transistor M1 are each extendedly formed in substrate 32 to overlap floating gate layer 38". N+ diffusion layer 152 extends under protrusion 150 of floating gate layer 38', or under thin-layer portion 40a of first gate insulating layer 40. With such an arrangement, the internal electric field in gate insulating layer 40 is highest at portion 40a. Therefore, in the erase mode or the write mode, the movement of carriers between floating gate 38' and drain 152 is effected only through thin-layer portion 40a of gate insulating layer 40. Consequently, even if the control gate voltage Vcg1, or word line voltage Vw1 is not set so high, the movement of carriers between floating gate 38' and drain 152 can effectively be promoted. This results in improved erase/write characteristics of the EEPROM and increased write speed.

Although the invention has been described with reference to specific embodiments, it will be understood by those skilled in the art that numerous modifications may be made that are within the spirit and scope of the inventive contribution.

Figure 27:
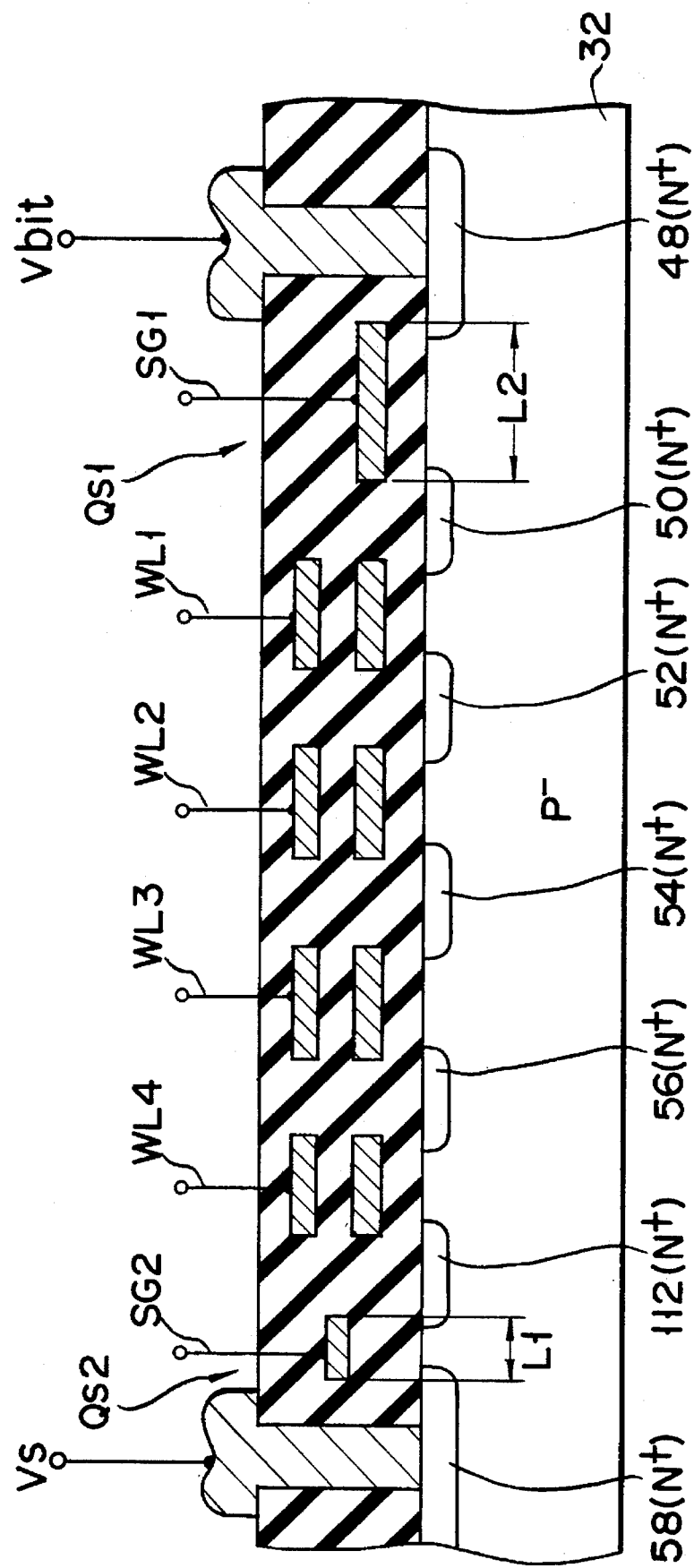
FIG. 27 a diagram showing a cross-sectional view of a modification of the NAND cell array shown in FIG. 13.

For example, in NAND cell block Bi having first and second selecting transistors Qs1 and Qs2, the channel length L2 of second selecting transistor Qs2, adapted to selectively connect the NAND cell array to the ground potential Vs, may be made smaller than the channel length L1 of first selecting transistor Qs1 adapted to selectively connect the transistor array to a corresponding bit line BLi, as emphatically shown in FIG. 27. Such an arrangement will result in an improvement in the punch-through of the EEPROM.

In the above embodiments each of the memory cells uses a floating gate. However, memory cells having the MNOS structure, wherein a silicon-nitride film and a silicon-oxide film are provided therein to constitute a charge-storing layer, may also be used in EEPROMs in accordance with this invention.

What is claimed is:

1. An electrically programmable semiconductor memory device comprising:

a semiconductive substrate;

a plurality of data storage transistors formed in a surface area of said substrate and including a plurality of transistors coupled to each other in series each having an insulated carrier storage layer and a control gate disposed over and insulated from said carrier storage layer;

a plurality of bit lines one of which is coupled to said plurality of transistors;

first switch means connected to said plurality of transistors at a first node thereof, for selectively coupling said plurality of transistors to the one bit line;

second switch means connected to said plurality of transistors at a second node thereof for selectively coupling said plurality of transistors to a source potential;

program means for, while sequentially programming said plurality of transistors, changing an amount of charge carriers stored in the carrier storage layer of a selected transistor of said plurality of transistors by tunneling to cause said selected transistor to be programmed with given data, said program means causing said first switch means and said second switch means to turn on applying a first voltage to the one bit line, applying a second voltage to the control gate of the selected transistor, and applying a voltage to the control gate of each non-selected transistor to render each non-selected transistor conductive so that the first voltage is transmitted from the one bit line to said selected transistor; and wherein said first switch means includes a first insulated gate transistor and said second switch means includes a second insulated gate transistor, said first insulated gate transistor has a greater channel length than that of said second insulated gate transistor.

2. The memory device according to claim 1, wherein said data storage transistors comprise floating gate metal oxide semiconductor field effect transistors.

3. The memory device according to claim 1, wherein the program means erases said plurality of transistors by causing the first and second switch means to turn off, and applying the third voltage to the control gate of each of said plurality of transistors.

4. An electrically programmable and erasable semiconductor memory device comprising:

a semiconductor substrate;

an array of memory cell transistors formed in a surface area of said substrate, said transistors including a plurality of memory cell transistors coupled in series between first and second nodes, each memory cell transistor having a control gate and an insulated charged storage layer;

a plurality of bit lines including a bit line connected with said plurality of memory cell transistors at the first node through a first switching transistor;

word lines connected to control gates of said plurality of memory cell transistors;

a second switching transistor coupled between the second node and a source potential;

program means for allowing said plurality of memory cells to be written with data bits sequentially while causing said first and second switching transistors to turn on, and for, when a selected memory cell transistor is to be programmed, applying a high level voltage to at least one first non-selected memory cell transistor positioned between said first switching transistor and said selected memory cell transistor so as to permit a data bit to be transmitted from a bit line toward said selected memory cell transistor by way of said first switching transistor and said at least one first non-selected memory cell transistor, while applying a low level voltage to at least one second non-selected memory cell transistor, whereby tunneling of charge carriers occurs in the charge storage layer of said selected memory cell transistor; and wherein said first switching transistor has a channel length greater than that of said second switching transistor and those of said memory cell transistors so that an occurrence of punch through decreases in said first switching transistor.

5. The device according to claim 4, wherein each of said first and second switching transistors includes an insulated gate metal oxide semiconductor field effect transistor.

6. The device according to claim 5, wherein each of said plurality of memory cell transistors includes a floating-gate metal oxide semiconductor field effect transistor.

* * * * *